(12) United States Patent
Hua

(10) Patent No.: US 10,680,010 B2
(45) Date of Patent: Jun. 9, 2020

(54) THREE-DIMENSIONAL MEMORY DEVICE HAVING ZIGZAG SLIT STRUCTURES AND METHOD FOR FORMING THE SAME

(71) Applicant: YANGTZE MEMORY TECHNOLOGIES CO., LTD., Wuhan (CN)

(72) Inventor: Wenyu Hua, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 18 days.

(21) Appl. No.: 16/195,835

(22) Filed: Nov. 19, 2018

(65) Prior Publication Data

US 2020/0127003 A1    Apr. 23, 2020

Related U.S. Application Data

(63) Continuation of application No. PCT/CN2018/110849, filed on Oct. 18, 2018.

(51) Int. Cl.

| | |
|---|---|
| *H01L 27/11* | (2006.01) |
| *H01L 29/40* | (2006.01) |
| *H01L 21/31* | (2006.01) |
| *H01L 27/11582* | (2017.01) |
| *H01L 21/28* | (2006.01) |
| *H01L 21/311* | (2006.01) |

(Continued)

(52) U.S. Cl.
CPC .. *H01L 27/11582* (2013.01); *H01L 21/31144* (2013.01); *H01L 27/1157* (2013.01); *H01L 27/11565* (2013.01); *H01L 29/40117* (2019.08)

(58) Field of Classification Search
CPC ......... H01L 27/11582; H01L 29/40117; H01L 21/31144
USPC .................. 438/216, 261, 591, 593; 257/324
See application file for complete search history.

(56) References Cited

U.S. PATENT DOCUMENTS

| | | | |
|---|---|---|---|
| 2009/0108333 A1 | 4/2009 | Kito et al. | |
| 2012/0091458 A1 | 4/2012 | Fumitake | |

(Continued)

FOREIGN PATENT DOCUMENTS

| | | |
|---|---|---|
| CN | 102201416 A | 9/2011 |
| CN | 104576595 A | 4/2015 |

(Continued)

OTHER PUBLICATIONS

International Search Report issued in corresponding International Application No. PCT/CN2018/110849, dated Jul. 18, 2019, 5 pages.

(Continued)

*Primary Examiner* — Sheikh Maruf
(74) *Attorney, Agent, or Firm* — Bayes, PLLC

(57) ABSTRACT

Embodiments of 3D memory devices having zigzag slit structures and methods for forming the same are disclosed. In an example, a 3D memory device includes a substrate, a memory stack including interleaved conductive layers and dielectric layers above the substrate, an array of memory strings each extending vertically through the memory stack, and a plurality of slit structures laterally dividing the array of memory strings into a plurality of memory regions. Each of the plurality of slit structures extends vertically through the memory stack and extends laterally in a first zigzag pattern in a plan view.

21 Claims, 15 Drawing Sheets

(51) Int. Cl.
*H01L 27/11565* (2017.01)
*H01L 27/1157* (2017.01)

(56) References Cited

U.S. PATENT DOCUMENTS

| | | | | |
|---|---|---|---|---|
| 2015/0035036 A1* | 2/2015 | Konno | ............... | H01L 27/11565 257/314 |
| 2015/0243672 A1* | 8/2015 | Kim | ............... | H01L 27/11582 257/324 |
| 2016/0172372 A1* | 6/2016 | Yun | ............... | H01L 27/11582 257/321 |
| 2016/0204117 A1* | 7/2016 | Liu | ............... | H01L 29/66825 257/324 |
| 2016/0204122 A1* | 7/2016 | Shoji | ............... | H01L 27/11575 257/324 |
| 2017/0033044 A1* | 2/2017 | Choi | ............... | H01L 27/11582 |
| 2017/0125433 A1* | 5/2017 | Ogawa | ............... | H01L 27/11565 |
| 2017/0148809 A1* | 5/2017 | Nishikawa | ............... | H01L 23/5226 |
| 2017/0148810 A1* | 5/2017 | Kai | ............... | H01L 23/535 |
| 2017/0148811 A1* | 5/2017 | Zhang | ............... | H01L 27/11519 |
| 2017/0179144 A1* | 6/2017 | Han | ............... | H01L 27/11524 |
| 2017/0236836 A1* | 8/2017 | Huo | ............... | H01L 27/11578 257/324 |
| 2017/0236896 A1* | 8/2017 | Lu | ............... | H01L 27/11582 257/314 |
| 2017/0271353 A1* | 9/2017 | Lee | ............... | H01L 27/11582 |
| 2017/0294377 A1* | 10/2017 | Dunga | ............... | H01L 27/2481 |
| 2018/0130814 A1* | 5/2018 | Lee | ............... | H01L 27/11565 |
| 2019/0244969 A1* | 8/2019 | Lee | ............... | H01L 27/11575 |
| 2019/0287989 A1* | 9/2019 | Mizutani | ............... | H01L 27/11582 |
| 2019/0371813 A1* | 12/2019 | Oike | ............... | H01L 27/11582 |

FOREIGN PATENT DOCUMENTS

| | | |
|---|---|---|
| CN | 105374824 A | 3/2016 |
| CN | 108028223 A | 5/2018 |
| CN | 108493192 A | 9/2018 |
| CN | 109003984 A | 12/2018 |

OTHER PUBLICATIONS

Written Opinion of the International Searching Authority issued in corresponding International Application No. PCT/CN2018/110849, dated Jul. 18, 2019, 5 pages.

* cited by examiner

THREE-DIMENSIONAL MEMORY DEVICE HAVING ZIGZAG SLIT STRUCTURES AND METHOD FOR FORMING THE SAME

CROSS REFERENCE TO RELATED APPLICATION

This application is continuation of International Application No. PCT/CN2018/110849, filed on Oct. 18, 2018, entitled "THREE-DIMENSIONAL MEMORY DEVICE HAVING ZIGZAG SLIT STRUCTURES AND METHOD FOR FORMING THE SAME," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices having zigzag slit structures and methods for forming the same are disclosed herein.

In an example, a 3D memory device includes a substrate, a memory stack including interleaved conductive layers and dielectric layers above the substrate, an array of memory strings each extending vertically through the memory stack, and a plurality of slit structures laterally dividing the array of memory strings into a plurality of memory regions. Each of the plurality of slit structures extends vertically through the memory stack and extends laterally in a first zigzag pattern in a plan view.

In another example, a method for forming a 3D memory device is disclosed. A dielectric stack including interleaved sacrificial layers and dielectric layers is formed above a substrate. A plurality of channel holes and a plurality of contact holes are formed through the dielectric stack. The plurality of contact holes are formed in a zigzag pattern in a plan view. A channel structure is formed in each of the channel holes. A memory stack including interleaved conductive layers and dielectric layers is formed by replacing, through the contact holes, the sacrificial layers in the dielectric stack with the conductive layers. A plurality of recesses abutting a sidewall of each of the contact holes are formed, such that the contact holes are joined laterally to form a slit opening. A spacer is formed along a sidewall of the slit opening to electrically separate the conductive layers of the memory stack.

In still another example, a method for forming a 3D memory device is disclosed. Interleaved sacrificial layers and dielectric layers are alternatingly deposited above a substrate. The interleaved sacrificial layers and dielectric layers are etched through to form a plurality of channel holes and a plurality of contact holes in a zigzag pattern in a plan view. Upper portions of the contact holes are joined laterally. A sealing layer is deposited in each of the contact holes. The sealing layer is etched away in each of the contact holes after depositing a channel structure in each of the channel holes. The sacrificial layers are replaced with a plurality of conductive layers through the contact holes. Parts of the conductive layers abutting a sidewall of each of the contact holes are etched, such that lower portions of the contact holes are joined laterally. A spacer is deposited along the sidewall of each of the contact holes.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
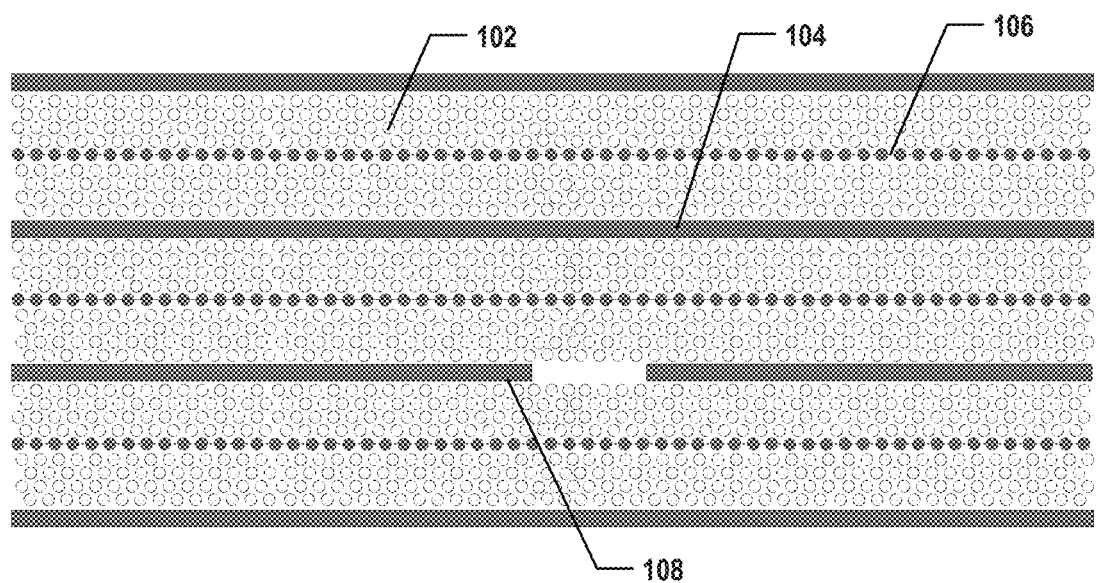
FIG. 1 illustrates a plan view of an exemplary 3D memory device.
Figure 1:
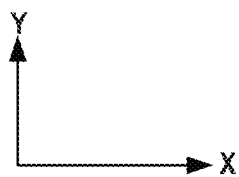

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, such as 3D NAND memory devices, some structures with relatively large dimensions, such as gate line slits (GLSs) and top select gate (TSG) cuts, extend along the same direction, which can cause unbalanced variations of wafer flatness (e.g., wafer bow and warpage) in different directions. As the level of memory stack increases, the issue of unbalanced wafer flatness variation becomes more serious. Moreover, as GLSs and TSG cuts in the existing 3D NAND memory devices all have a pattern of parallel straight lines in the plan view, the distance for depositing gate line materials (e.g., tungsten) is relatively long during the gate replacement processes, which makes the fabrication process more challenging.

For example, FIG. 1 illustrates a plan view of an exemplary 3D memory device 100. 3D memory device 100 includes an array of NAND memory strings 102 and multiple parallel GLSs 104, which divide array of NAND memory strings 102 into different memory regions (e.g., memory blocks). 3D memory device 100 also includes multiple parallel TSG cuts 106 that separate the electrical connections between TSGs of NAND memory strings 102 in different regions. As shown in FIG. 1, each GLS 104 and TSG cut 106 extends laterally along the word line direction in a straight-line pattern in the plan view (parallel to the wafer plane). It is noted that x and y axes are included in FIG. 1 to illustrate two orthogonal directions in the wafer plane. The x-direction is the word line direction, and the y-direction is the bit line direction. 3D memory device 100 also includes "H" cuts 108 that laterally separate each memory block into multiple memory fingers.

Etching of GLSs 104 and TSG cuts 106 can result in a large number of parallel trenches in the x-direction, which can cause a substantial change of wafer bow and/or warpage in the x-direction, but not in the y-direction. Further, during the gate replacement processes, conductive materials for forming the gate lines of NAND memory strings 102 need to travel a relatively long distance between each GLS 104 and adjacent TSG cuts 106, which can be challenging for high-quality deposition.

Various embodiments in accordance with the present disclosure provide an improved slit structure scheme suitable for combined channel hole and slit opening etching. The zigzag pattern of slit structures (e.g., GLSs) can reduce the bias of wafer bow and/or warpage in different directions and process complexity of gate line deposition without sacrificing the pitch of the multiple parallel slit structures.

From the fabrication perspective, the zigzag pattern of slit structures allows channel holes and slit openings to be simultaneously etched in the same fabrication step, while maintaining the uniformity of inner channel holes and outer channel holes against the loading effect. In some embodiments, each slit opening is formed by joining a plurality of contact holes arranged in the zigzag pattern to balance the loading when simultaneously etching the channel holes and slit openings. In some embodiments, an H cut can be easily formed as well by skipping one or more contact holes in the zigzag pattern when etching the slit opening.

Figure 2A:
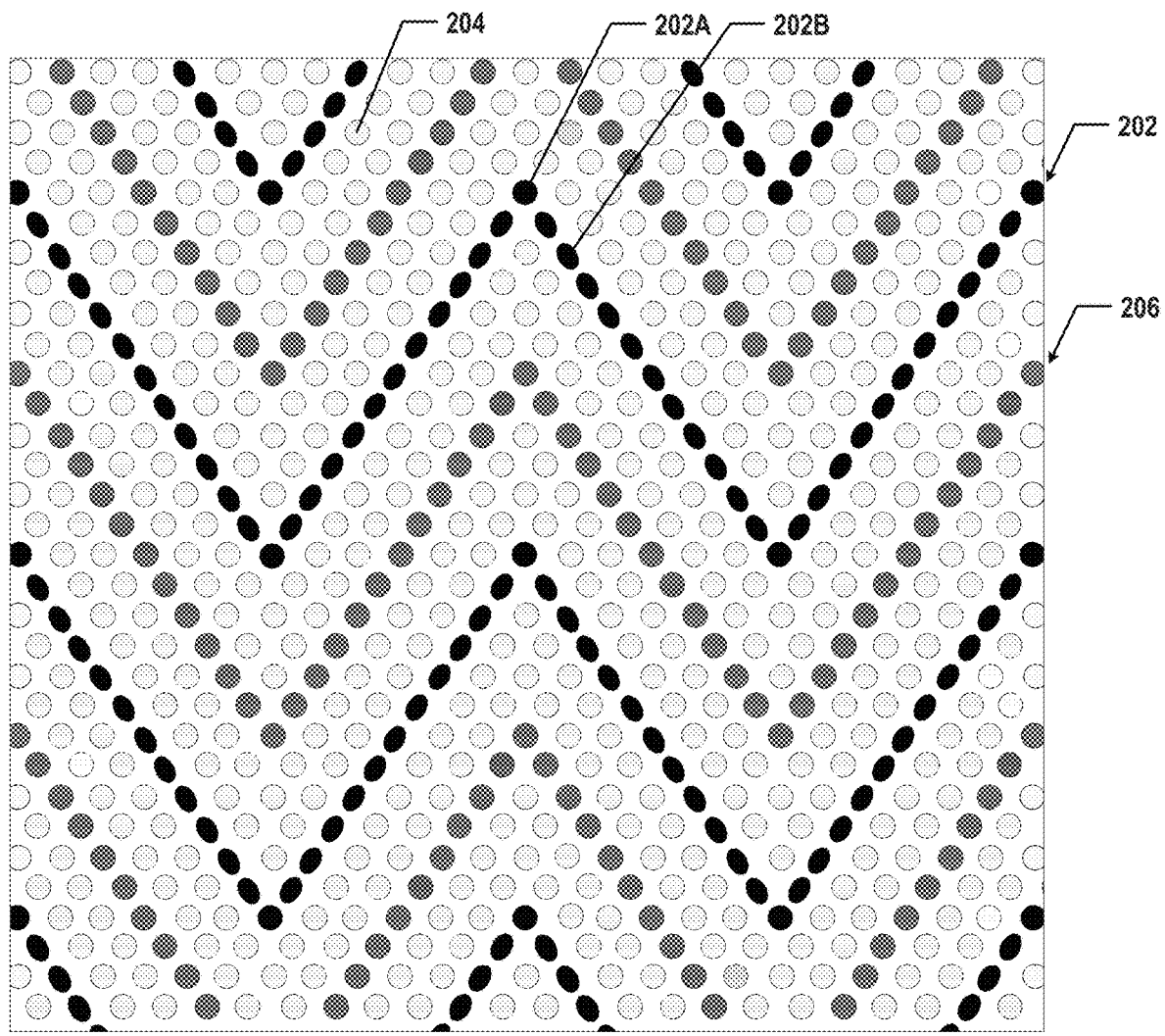
FIGS. 2A-2B illustrate a scheme of contact holes in a zigzag pattern and channel holes in an exemplary 3D memory device, according to some embodiments of the present disclosure.
Figure 2A:
Figure 2B:
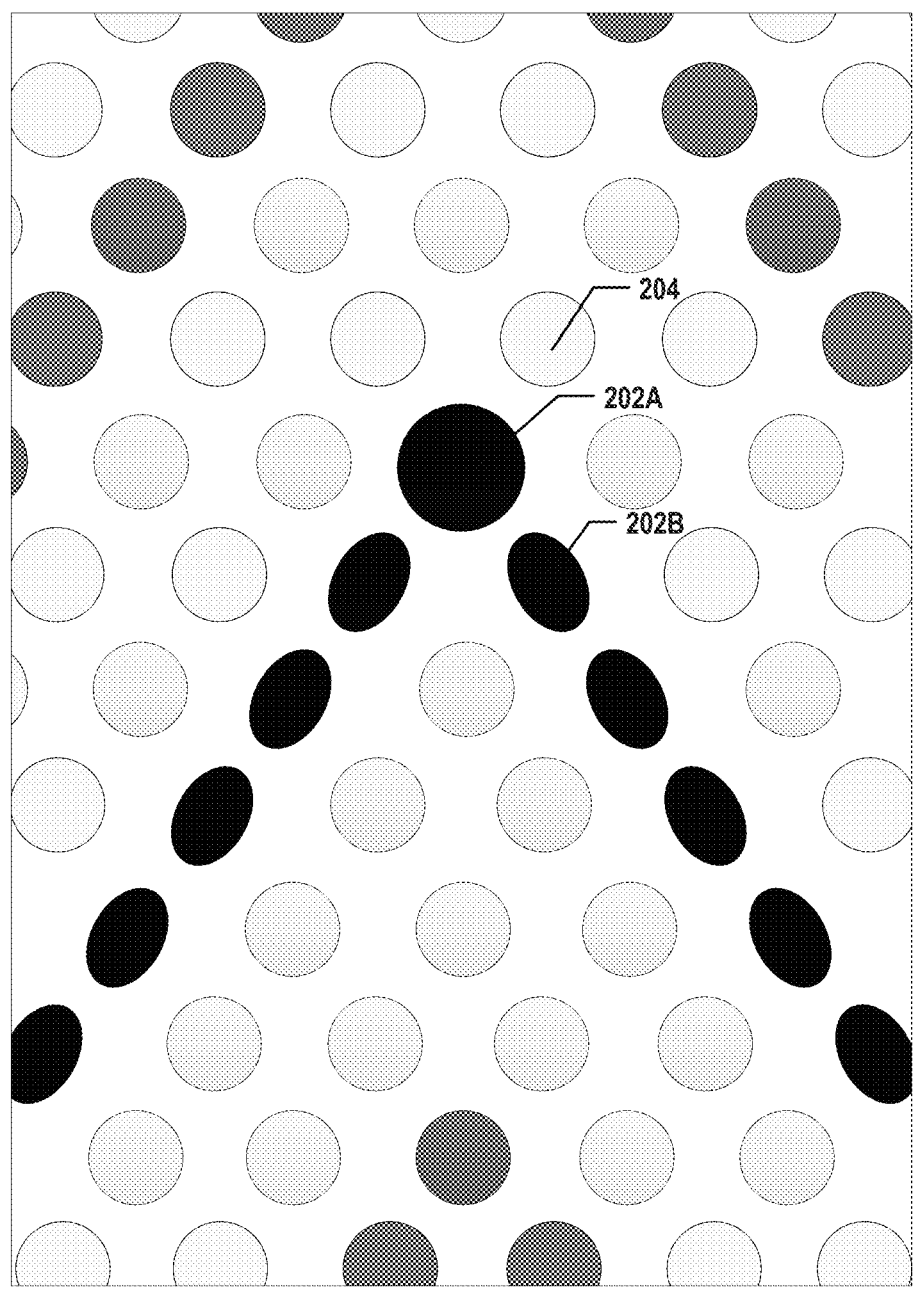

FIGS. 2A-2B illustrate a scheme of contact holes 202 in a zigzag pattern and channel holes 204 in an exemplary 3D memory device 200, according to some embodiments of the present disclosure. FIG. 2A shows the arrangement of channel holes 204 and contact holes 202A and 202B (collectively 202) in the plan view (parallel to the wafer plane). The arrangement can be applied to a photolithography mask and/or an etching mask (e.g., a photoresist mask or hard mask) for simultaneously patterning and etching channel holes 204 and contact holes 202. In some embodiments in which 3D memory device 200 is a 3D NAND Flash memory device, NAND memory strings can be formed at the locations of channel holes 204, and slit structures (e.g., GLSs or array common source (ACS) contacts) can be formed in the zigzag pattern of contact holes 202.

As illustrated in FIG. 2A and the enlarged view of FIG. 2B, each channel hole 204 can have a nominally circular shape in the plan view. In some embodiments, the diameter of each channel hole 204 is nominally the same. Contact holes 202 can be arranged in a plurality of zigzag patterns, which divide channel holes 204 into a plurality of memory regions, such as memory blocks. In some embodiments, contact holes 202 are arranged in parallel zigzag patterns that are spaced apart in the same pitch. Each zigzag pattern can be symmetrical and include a plurality turns each at the same angle. For example, the angle can be 60°. To reduce the bias of wafer bow and/or warpage in the x- and y-directions, in some embodiments, each zigzag pattern does not have any part extending along the x-direction or y-direction. That is, each zigzag pattern is not along the word line direction or the bit line direction, according to some embodiments. The turn angle of each zigzag patterns thus can be between 0° and 180° (not inclusive). As shown in FIG. 2A, 3D memory device 200 can further include a plurality of cut holes 206 arranged in parallel zigzag patterns for forming TSG cuts. The specific arrangement of cut holes 206 for TSG cuts can be the same as the arrangement of contact holes 202 for slit structures and thus, is not repeated. In some embodiments, the zigzag patterns of cut holes 206 are parallel to the zigzag patterns of contact holes 202.

As shown in the enlarged view of FIG. 2B, depending on their locations in the zigzag pattern (e.g., whether at the turns of the zigzag pattern), contact holes 202 can either have a nominally circular shape (contact holes 202A at the turns) or a nominally oval shape (contact holes 202B not at the turns). In some embodiments, the critical dimension of contact hole 202A at the turn of the zigzag pattern is larger than the critical dimension of contact hole 202B not at the turn of the zigzag pattern. In some embodiments, the critical dimension of contact hole 202A is larger than the critical dimension of channel hole 204. Contact holes 202B have a nominally ellipse shape in the plan view and have their major axes aligned along the zigzag pattern, according to some embodiments. The distance between adjacent contact holes 202 is sufficiently small to ensure that after etching, adjacent contact holes 202 are enlarged laterally to be joined together to form a continuous slit opening in a zigzag pattern, according to some embodiments.

Figure 3:
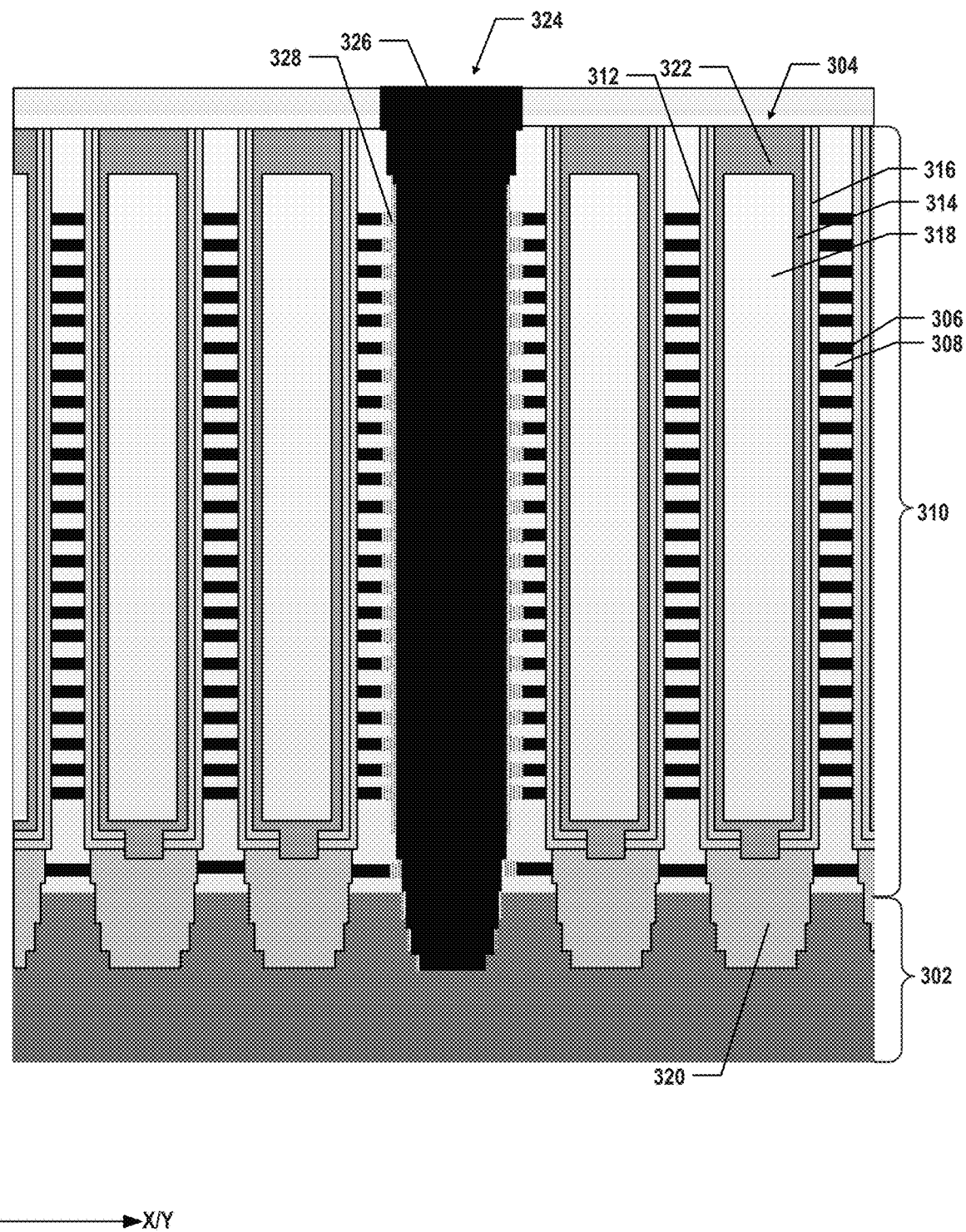
FIG. 3 illustrates a cross-section of an exemplary 3D memory device, according to some embodiments of the present disclosure.

FIG. 3 illustrates a cross-section of an exemplary 3D memory device 300, according to some embodiments of the present disclosure. 3D memory device 300 can include a substrate 302, which can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 302 is a thinned substrate (e.g., a semiconductor layer), which was thinned by grinding, etching, chemical mechanical polishing (CMP), or any combination thereof.

3D memory device 300 can include memory array devices above substrate 302. It is noted that x/y and z axes are included in FIG. 3 to further illustrate the spatial relationship of the components in 3D memory device 300. Substrate 302 includes two lateral surfaces extending laterally in the x-y plane: a top surface on the front side of the wafer on which 3D memory device 300 can be formed, and a bottom surface on the backside opposite to the front side of the wafer. The z axis is perpendicular to both the x and y axes. As used herein, whether one component (e.g., a layer or a device) is "on," "above," or "below" another component (e.g., a layer or a device) of a semiconductor device (e.g., 3D memory device 300) is determined relative to the substrate of the semiconductor device (e.g., substrate 302) in the z-direction (the vertical direction perpendicular to the x-y plane) when the substrate is positioned in the lowest plane of the semiconductor device in the z-direction. The same notion for describing spatial relationship is applied throughout the present disclosure.

3D memory device 300 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND memory strings) is constrained by the thermal budget associated with the peripheral devices that have been formed or to be formed on the same substrate.

Alternatively, 3D memory device 300 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 302) remains as the substrate of the bonded non-monolithic 3D memory device, and the peripheral device (e.g., including any suitable digital, analog, and/or mixed-signal peripheral circuits used for facilitating the operation of 3D memory device 300, such as page buffers, decoders, and latches; not shown) is flipped and faces down toward the memory array device (e.g., NAND memory strings) for hybrid bonding. It is understood that in some embodiments, the memory array device substrate (e.g., substrate 302) is flipped and faces down toward the peripheral device (not shown) for hybrid bonding, so that in the bonded non-monolithic 3D memory device, the memory array device is above the peripheral device. The memory array device substrate (e.g., substrate 302) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

In some embodiments, 3D memory device 300 is a NAND Flash memory device in which memory cells are provided in the form of an array of NAND memory strings 304 each extending vertically above substrate 302. The memory array device can include NAND memory strings 304 that extend through a plurality of pairs each including a conductive layer 306 and a dielectric layer 308 (referred to herein as "conductor/dielectric layer pairs"). The stacked conductor/dielectric layer pairs are also referred to herein as a "memory stack" 310. In some embodiments, an insulation layer (not shown) is formed between substrate 302 and memory stack 310. The number of the conductor/dielectric layer pairs in memory stack 310 (e.g., 32, 64, 96, or 128) determines the number of memory cells in 3D memory device 300. Memory stack 310 can include interleaved conductive layers 306 and dielectric layers 308. At least on one side in the lateral direction, memory stack 310 can include a staircase structure (not shown). Conductive layers 306 and dielectric layers 308 in memory stack 310 can alternate in the vertical direction. Conductive layers 306 can include conductive materials including, but not limited to, tungsten (W), cobalt (Co), copper (Cu), aluminum (Al), polysilicon, doped silicon, silicides, or any combination thereof. Dielectric layers 308 can include dielectric materials including, but not limited to, silicon oxide, silicon nitride, silicon oxynitride, or any combination thereof.

As shown in FIG. 3, NAND memory string 304 can include a channel structure 312 extending vertically through memory stack 310. Channel structure 312 can include a channel hole filled with semiconductor materials (e.g., as a semiconductor channel 314) and dielectric materials (e.g., as a memory film 316). In some embodiments, semiconductor channel 314 includes silicon, such as amorphous silicon, polysilicon, or single crystalline silicon. In some embodiments, memory film 316 is a composite layer including a tunneling layer, a storage layer (also known as a "charge trap layer"), and a blocking layer. The remaining space of the channel hole of channel structure 312 can be partially or fully filled with a capping layer 318 including dielectric materials, such as silicon oxide. Channel structure 312 can have a cylinder shape (e.g., a pillar shape). Capping layer 318, semiconductor channel 314, the tunneling layer, the storage layer, and the blocking layer are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, memory film 316 can include a composite layer of silicon oxide/silicon oxynitride (or silicon nitride)/silicon oxide (ONO).

In some embodiments, conductive layer 306 in memory stack 310 functions as a gate conductor/gate line of memory cells in NAND memory string 304. Conductive layer 306 can include multiple control gates of multiple NAND memory cells and can extend laterally as a word line ending at the edge of memory stack 310 (e.g., in a staircase structure of memory stack 310). In some embodiments, the word lines extend in the x-direction (shown in FIG. 2A) perpendicular to both the y-direction and z-direction. The bit lines extend in the y-direction (shown in FIG. 2B) perpendicular to both the x-direction and z-direction. In some embodiments, memory cell transistors in NAND memory string 304 include gate conductors (e.g., parts of conductive layers 306 that abut channel structure 312) made from tungsten, adhesion layers (not shown) including titanium/titanium nitride (Ti/TiN) or tantalum/tantalum nitride (Ta/TaN), gate dielectric layers (not shown) made from high-k dielectric materials, and channel structure 312.

In some embodiments, NAND memory string 304 further includes a semiconductor plug 320 in the lower portion (e.g., at the lower end) of NAND memory string 304. As used herein, the "upper end" of a component (e.g., NAND memory string 304) is the end farther away from substrate 302 in the z-direction, and the "lower end" of the component (e.g., NAND memory string 304) is the end closer to substrate 302 in the z-direction when substrate 302 is positioned in the lowest plane of 3D memory device 300. Semiconductor plug 320 can include a semiconductor material, such as silicon, which is epitaxially grown from substrate 302 in any suitable directions. It is understood that in some embodiments, semiconductor plug 320 includes single crystalline silicon, the same material of substrate 302. In other words, semiconductor plug 320 can include an epitaxially-grown semiconductor layer that is the same as the material of substrate 302. In some embodiments, part of semiconductor plug 320 is above the top surface of substrate 302 and in contact with semiconductor channel 314. Semiconductor plug 320 can function as a channel controlled by a source select gate of NAND memory string 304.

In some embodiments, NAND memory string 304 further includes a channel plug 322 in the upper portion (e.g., at the upper end) of NAND memory string 304. Channel plug 322 can be in contact with the upper end of semiconductor channel 314. Channel plug 322 can include semiconductor materials (e.g., polysilicon) or conductive materials (e.g., metals). In some embodiments, channel plug 322 includes an opening filled with Ti/TiN or Ta/TaN as an adhesion layer and tungsten as a conductor layer. By covering the upper end of channel structure 312 during the fabrication of 3D memory device 300, channel plug 322 can function as an etch stop layer to prevent etching of dielectrics filled in channel structure 312, such as silicon oxide and silicon nitride. In some embodiments, channel plug 322 also functions as the drain of NAND memory string 304.

In some embodiments, 3D memory device 300 further includes slit structures 324. Each slit structure 324 can extend vertically through memory stack 310. In some embodiments, slit structure 324 includes a slit opening (e.g., a trench) filled with conductive materials as a slit contact 326. Slit structure 324 can further include a spacer 328 made of any suitable dielectric materials (e.g., silicon oxide) between slit contact 326 and memory stack 310 to electrically separate surrounding conductive layers 306 in memory stack 310. As a result, slit structures 324 can laterally separate 3D memory device 300 into multiple memory regions, such as memory blocks. In some embodiments, slit structure 324 functions as the source contact for NAND memory strings 304 in the same memory region (e.g., memory block) sharing the same ACS. Slit structure 324 can thus be referred to as an ACS contact of multiple NAND memory strings 304. In some embodiments, substrate 302 includes a doped region (not shown), and the lower end of slit structure 324 is in contact with the doped region of substrate 302. Slit contact 326 of slit structure 324 thus can electrically connect to channel structures 312 of NAND memory strings 304.

As described below in detail, due to the limitations of etching process (e.g., deep reactive ion etch (DRIE)) for forming the slit opening, in particular when the levels of memory stack 310 continue to increase, the sidewall profile of the slit opening is not straight up as shown in FIG. 3, but rather being tilted. In some embodiments, the lateral dimension of the slit opening (and slit structure 324) decreases from top to bottom. That is, the lateral dimension of slit structures 324 in its upper portion can be greater than the lateral dimension in its lower portion.

Figure 4A:
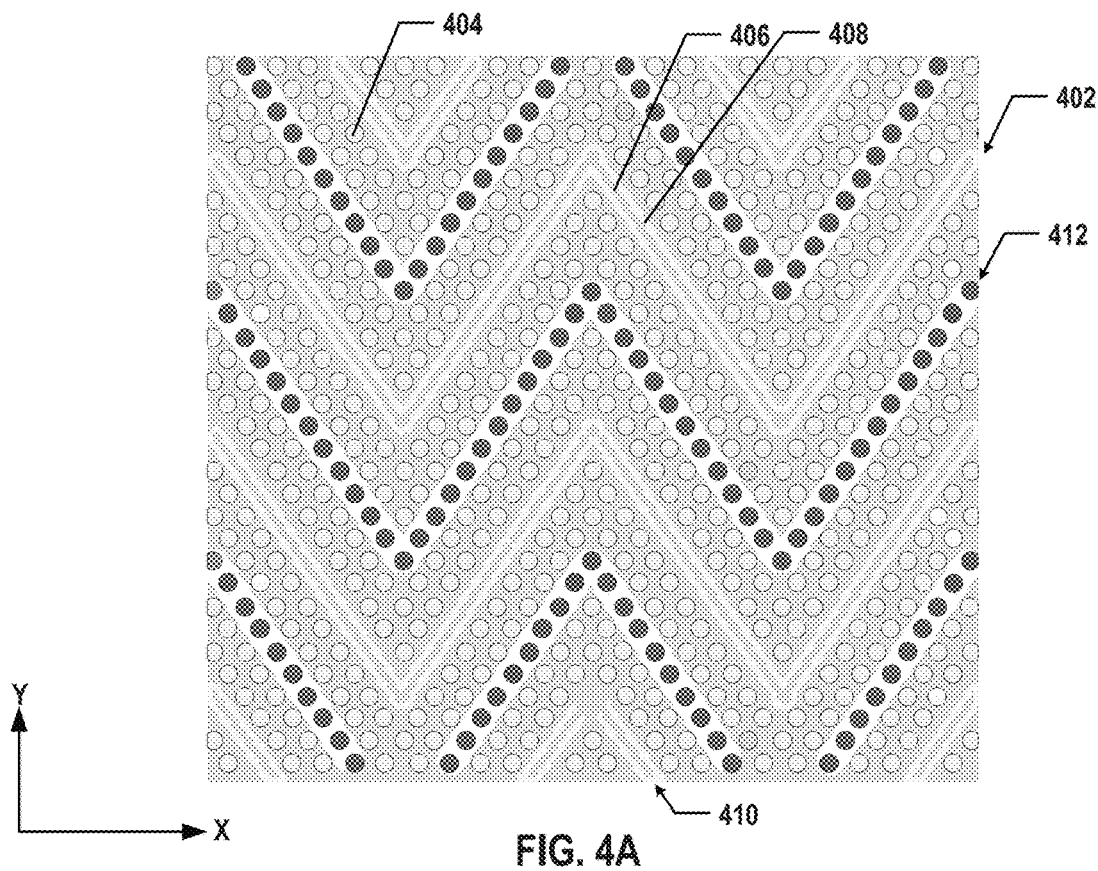
FIGS. 4A-4B illustrate plan views of an exemplary 3D memory device having zigzag slit structures, according to some embodiments of the present disclosure.
Figure 4B:
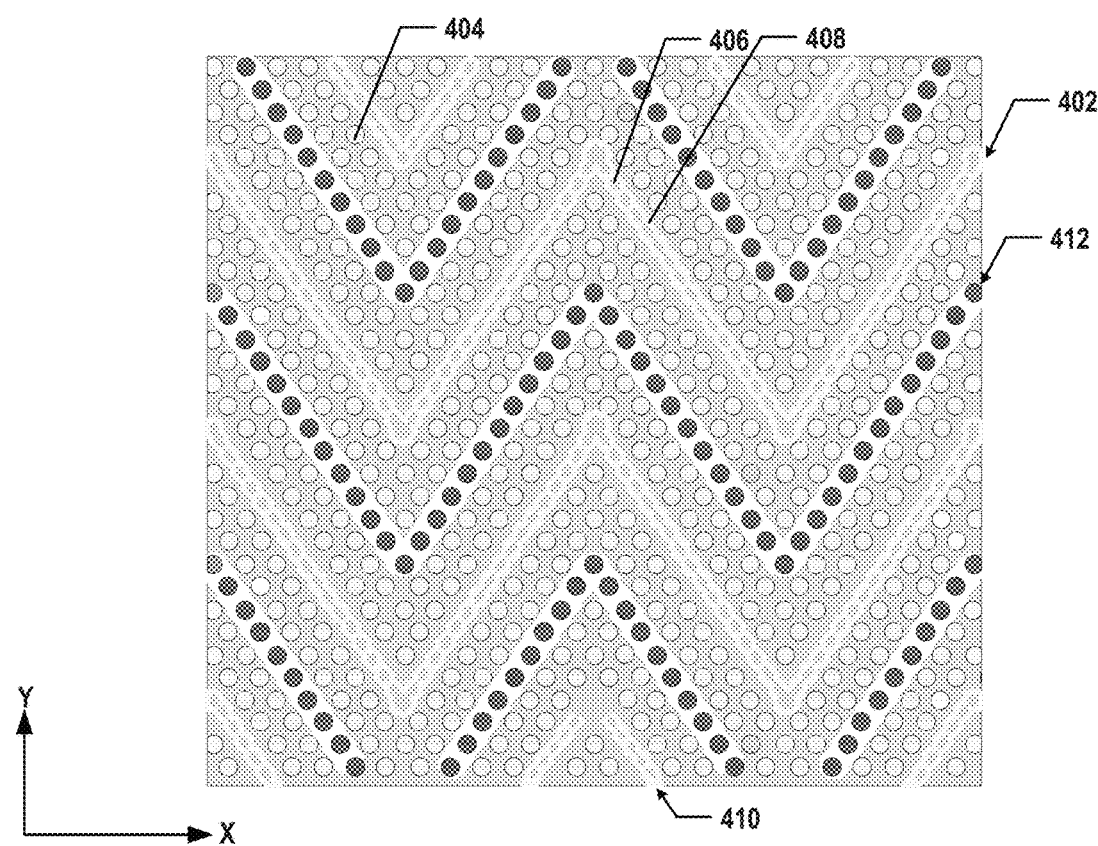

FIGS. 4A-4B illustrate plan views of an exemplary 3D memory device having zigzag slit structures 402, according to some embodiments of the present disclosure. Examples of the 3D memory device can include 3D memory device 300 in FIG. 3. The 3D memory device can be formed by implementing the scheme of channel holes and contact holes described above with respect to FIG. 2A. FIG. 4A and FIG. 4B show the cross-sections (in the x-y plane) of the upper portion and lower portion, respectively, of the memory stack (through one of its conductive layers) and structures therein of the 3D memory device (e.g., 3D memory device 300).

As shown in FIG. 4A, slit structures 402 laterally divide an array of NAND memory strings 404 into a plurality of memory regions, such as memory blocks, according to some embodiments. Each slit structure 402 can include a continuous slit contact 406 made of conductive materials, such as a Ti/TiN or Ta/TaN adhesion layer and a tungsten conductor layer. Slit structure 402 can also include a continuous spacer 408 at its edges surrounding slit contact 406 to electrically insulate slit contact 406 from the conductive layers (e.g., gate lines) filling most of the area in the plan view (e.g., as a conductor plate). In some embodiments, spacer 408 includes dielectric materials, such as silicon oxide, and laterally separates the conductive layers (e.g., gate lines) into different memory regions. In some embodiments, slit contact 406 and spacer 408 fill in a slit opening of slit structure 402, which is formed by laterally joining a plurality of contact holes arranged in a zigzag pattern as described above with respect to contact holes 202 in FIGS. 2A-2B.

As shown in FIG. 4A, slit structure 402 extends laterally (in the x-y plane) in a zigzag pattern in the plan view. Multiple slit structures 402 can be spaced apart in the same pitch. The zigzag pattern can be symmetrical and include a plurality of turns each at the same angel, such as 60°. As the slit opening of slit structure 402 is formed by laterally joining a series of contact holes after etching, each of which has a nominally circular or oval shape in the plan view, the edge of the zigzag pattern (and slit structure 402) is wave-like, according to some embodiments as shown in FIG. 4A. As described above, due to the etching process limitations, when etching the contact holes based on the scheme shown in FIG. 2A, the upper portion of each contact hole is enlarged (e.g., increasing the lateral dimension compared with the contact hole pattern on the mask). As a result, the upper portions of adjacent contact holes in the zigzag pattern are joined to form a continuous slit opening in a zigzag pattern.

In some embodiments, one or more of slit structures 402 can become H cuts 410 by removing one or more contact holes from the zigzag pattern. The missing contact hole(s) can be at the turns and/or not so long as resulting H cut 410 does not fully separate the conductive layers (e.g., gate lines) of the memory stack. H cuts 410 can divide NAND memory strings 404 in the same memory block further into multiple memory fingers. In H cut 410, most of the contact holes are joined laterally except at least two of the contact holes are separated laterally. In some embodiments, the 3D memory device further includes a plurality of TSG cuts 412 each extending laterally in a zigzag pattern as well. TSG cuts 412 can be nominally parallel to slit structures 402. Different from slit structure 402 which extends vertically through the entire memory stack to electrically separate the conductive layers (e.g., shown in FIG. 3), in some embodiments, each TSG cut 412 extends vertically through only part of the memory stack so long as it can separate the electrical connections of the TSGs of NAND memory strings 404 in different regions.

FIG. 4B illustrates the cross-sections of the lower portion of the memory stack and structures therein of the 3D memory device (e.g., 3D memory device 300). The arrangement and profiles of the structures described above in FIG. 4A are similar in FIG. 4B and thus, are not repeated in detail. As described above, due to the etching process limitations, the contact holes for forming slit structures 402 after etching each has a tilted sidewall profile with a smaller lateral dimension in the lower portion. Compared with the lateral profile (e.g., edges) of slit structures 402 in FIG. 4A, the individual lateral profile of each contact hole is better preserved in the lower portion than in the upper portion. As shown in FIG. 4B, the contact holes at the turns of the zigzag pattern of slit structure 402 have a nominally circular shape, and the rest of the contact holes not at the turns have a nominally oval shape in the plan view. As described below in detail, in some embodiments, recesses are formed by removing parts of the conductive layers abutting the sidewall each contact hole and filled with spacer 408 to ensure that spacer 408 is continuous along the zigzag pattern even in the lower portion to fully separate the conductive layers in different memory blocks.

Figure 7:
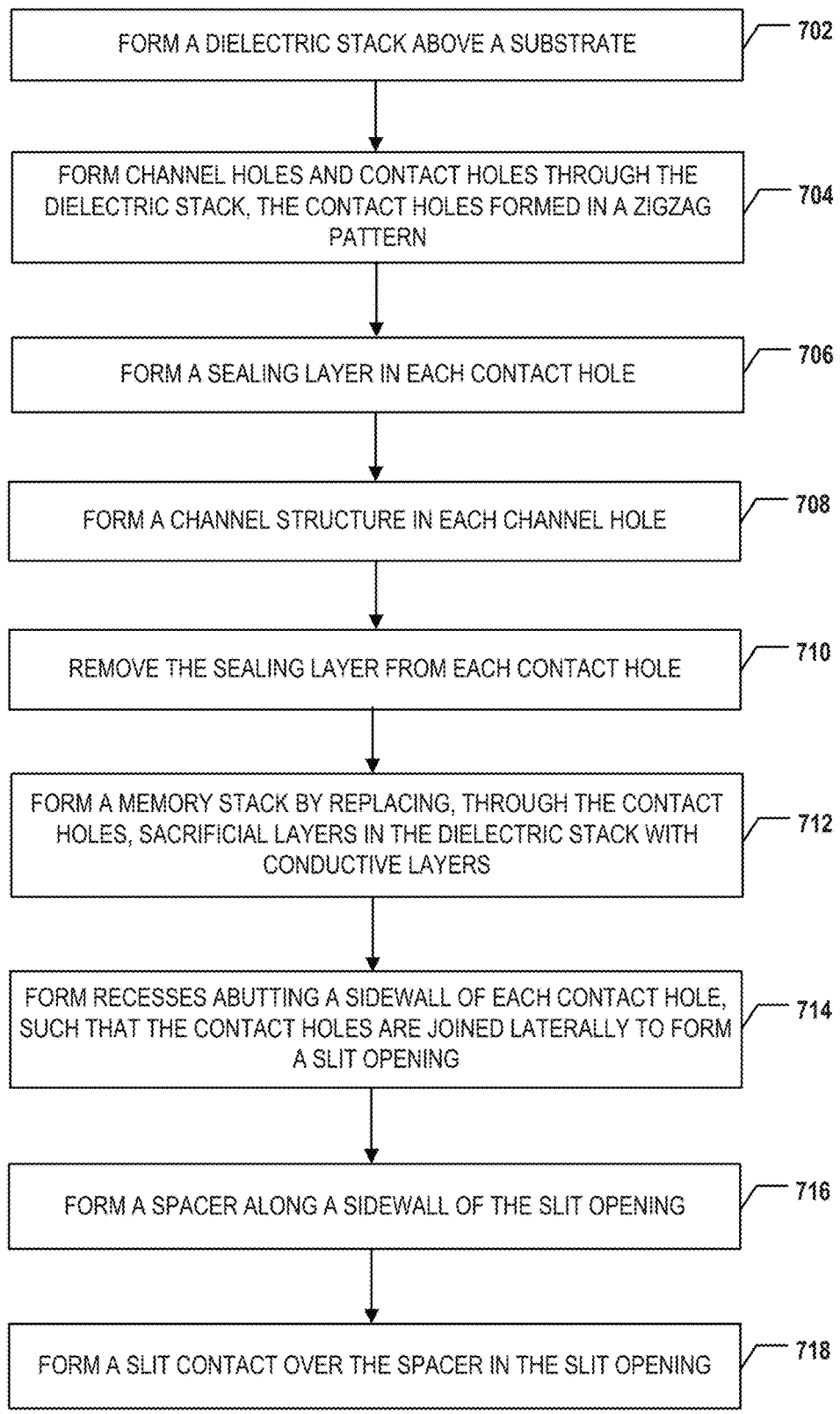
FIG. 7 illustrates a flowchart of an exemplary method for forming a 3D memory device, according to some embodiments of the present disclosure.
Figure 8:
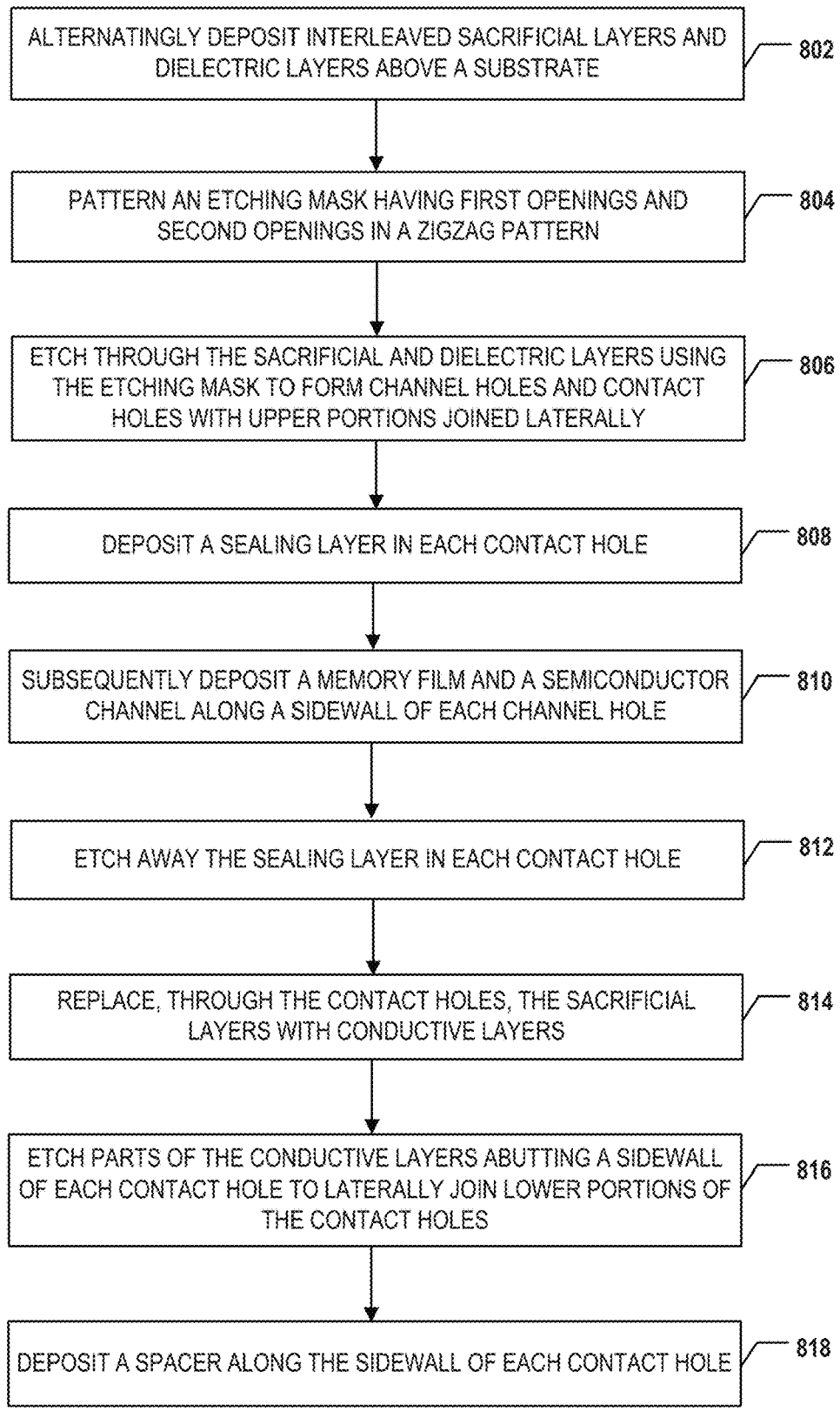
FIG. 8 illustrates a flowchart of another exemplary method for forming a 3D memory device, according to some embodiments of the present disclosure.

FIGS. 5A-5L illustrate an exemplary fabrication process for forming a 3D memory device, according to some embodiments of the present disclosure. FIG. 7 illustrates a flowchart of an exemplary method 700 for forming a 3D memory device, according to some embodiments of the present disclosure. FIG. 8 illustrates a flowchart of another exemplary method 800 for forming a 3D memory device, according to some embodiments of the present disclosure. Examples of the 3D memory device depicted in FIGS. 5A-5L and 7-8 include 3D memory device 300 depicted in FIG. 3. FIGS. 5A-5L and 7-8 will be described together. It is understood that the operations shown in methods 700 and 800 are not exhaustive and that other operations can be performed as well before, after, or between any of the illustrated operations. Further, some of the operations may be performed simultaneously, or in a different order than shown in FIGS. 7-8.

Referring to FIG. 7, method 700 starts at operation 702, in which a dielectric stack is formed above a substrate. The substrate can be a silicon substrate. The dielectric stack can include interleaved sacrificial layers and dielectric layers. In the example of FIG. 8, at operation 802, interleaved sacrificial layers and dielectric layers are alternatingly deposited above a substrate.

Figure 5A:
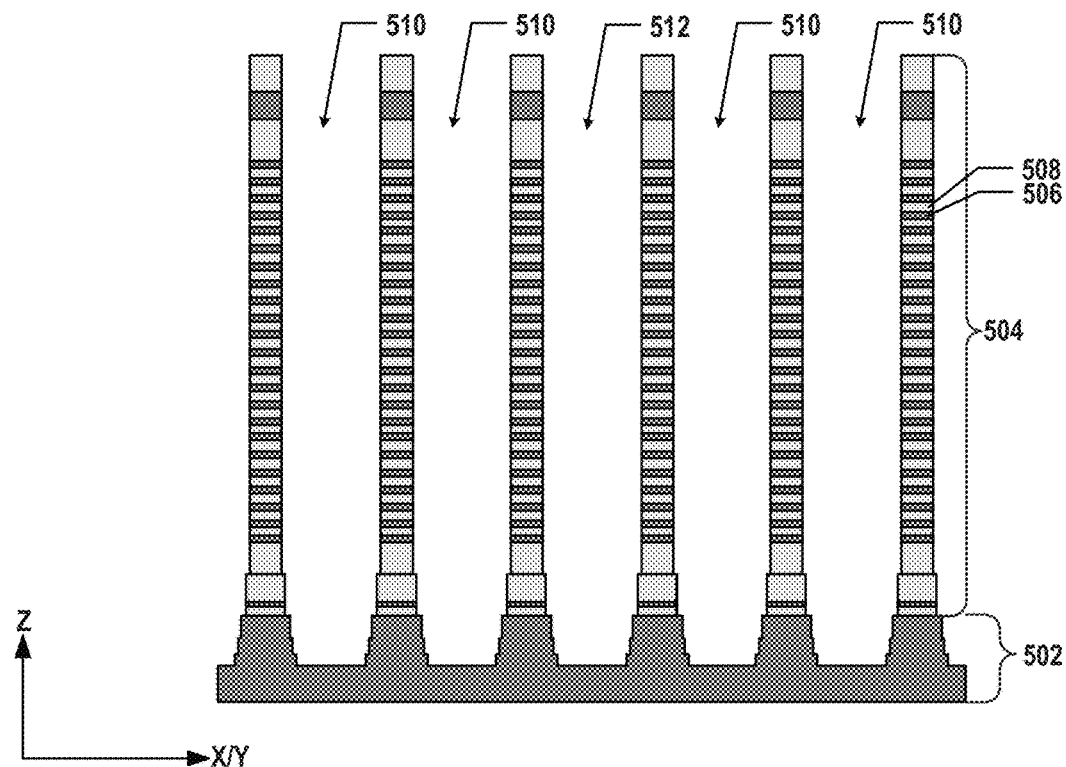
FIGS. 5A-5L illustrate an exemplary fabrication process for forming a 3D memory device, according to some embodiments of the present disclosure.

Referring to FIG. 5A, a dielectric stack 504 including a plurality pairs of a first dielectric layer (also known as a "sacrificial layer" 506) and a second dielectric layer 508 (together referred to herein as "dielectric layer pairs") is formed above a silicon substrate 502. That is, dielectric stack 504 includes interleaved sacrificial layers 506 and dielectric layers 508, according to some embodiments. Dielectric layers 508 and sacrificial layers 506 can be alternatingly deposited on silicon substrate 502 to form dielectric stack 504. In some embodiments, each dielectric layer 508 includes a layer of silicon oxide, and each sacrificial layer 506 includes a layer of silicon nitride. Dielectric stack 504 can be formed by one or more thin film deposition processes including, but not limited to, chemical vapor deposition (CVD), physical vapor deposition (PVD), atomic layer deposition (ALD), or any combination thereof. In some embodiments, an insulation layer (not shown) is formed between silicon substrate 502 and dielectric stack 504 by depositing dielectric materials, such as silicon oxide, on silicon substrate 502.

Method 700 proceeds to operation 704, as illustrated in FIG. 7, in which a plurality of channel holes and a plurality of contact holes are formed through the dielectric stack. The plurality of channel holes and a plurality of contact holes can be simultaneously formed through the dielectric stack. The plurality of contact holes are formed in a zigzag pattern in the plan view. In the example shown in FIG. 8, at operation 804, an etching mask is patterned on the interleaved sacrificial layers and dielectric layers. The etching mask includes a plurality of first openings and a plurality of second openings. The second openings are formed in a zigzag pattern in the plan view. In the example shown in FIG. 8, at operation 806, the interleaved sacrificial layers and dielectric layers are etched through using the etching mask, such that a plurality of channel holes are formed from the first openings and a plurality of contact holes are formed from the second openings. The upper portions of the contact holes are joined laterally after the etching.

As illustrated in FIG. 5A, a plurality of channel holes 510 and contact holes 512 are simultaneously formed through dielectric stack 504. In some embodiments, an etching mask (not shown) is patterned on dielectric stack 504 by photolithography, development, and etching. The etching mask can be a photoresist mask or a hard mask patterned based on a photolithography mask. The photography mask and/or etching mask can have patterns of channel holes 510 and contact holes 512 thereon as shown in the example of FIG. 2A above. In some embodiments, the etching mask includes an array of first openings for forming channel holes 510 and second openings for forming contact holes 512 that are formed in a zigzag pattern in the plan view, which laterally divide the first openings into multiple regions. The zigzag pattern of the second openings can be symmetrical and include a plurality of turns each at the same angle, such as 60°. The second openings at the turns of the zigzag pattern have a nominally circular shape in the plan view, and the rest of the second openings not at the turns have a nominally oval shape in the plan view, according to some embodiments. Additional details of the patterns of the etching mask are described above with respect to FIG. 2A.

As illustrated in FIG. 5A, parts of dielectric stack 504 are etched through by one or more wet etching and/or dry etching processes, such as DRIE, using the patterned etching mask to simultaneously form channel holes 510 and contact holes 512 in a pattern defined by the photolithography mask and etching mask. In some embodiments, channel hole 510 and contact hole 512 extend vertically further into the upper portion of silicon substrate 302. The etching process through dielectric stack 504 may not stop at the top surface of silicon substrate 502 and may continue to etch part of silicon substrate 502. In some embodiments, a separate etching process is used to etch part of silicon substrate 502 after etching through dielectric stack 504. In some embodiments, each contact hole 512 is enlarged compared with the corresponding second opening on the etching mask after etching contact hole 512 (e.g., by DRIE), in particular the lateral dimension of its upper portion. As a result, the upper portions of contact holes 512 can be joined laterally. That is, the discrete second openings on the etching mask can be transferred into joined contact holes 512 in a zigzag pattern by an etching step. The etching step can simultaneously form both channel hole 510 and contact hole 512, thereby reducing the fabrication steps and cost. Moreover, by simultaneously etching channel holes 510 and contact hole 512 with similar shapes and sizes (compared with etching slit openings having a long strip shape in fabricating existing 3D memory devices), the issue of non-uniform inner and outer channel holes due to loading effect can be addressed.

Figure 5B:
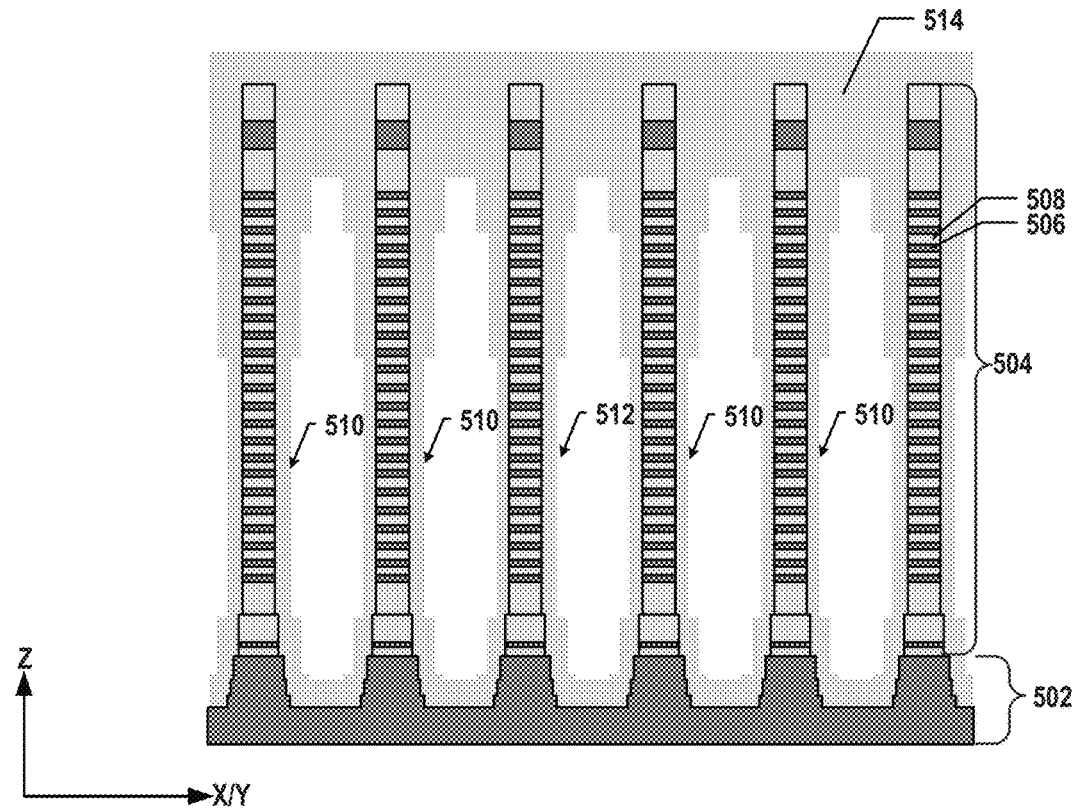
Figure 5C:
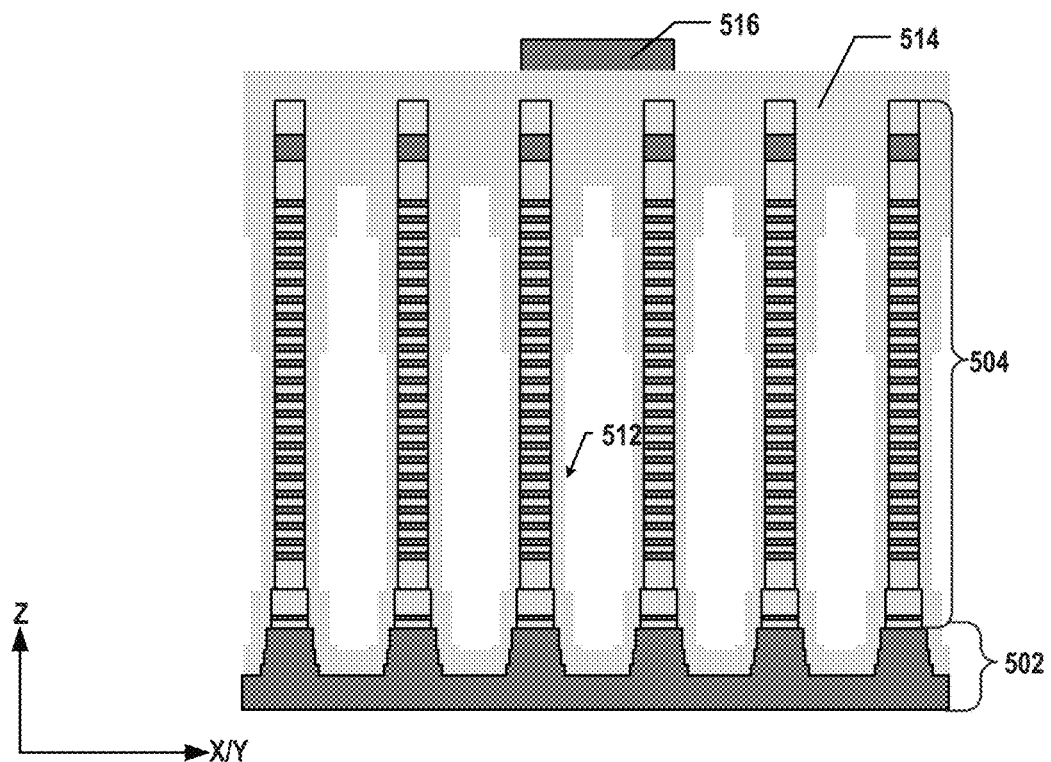
Figure 5D:
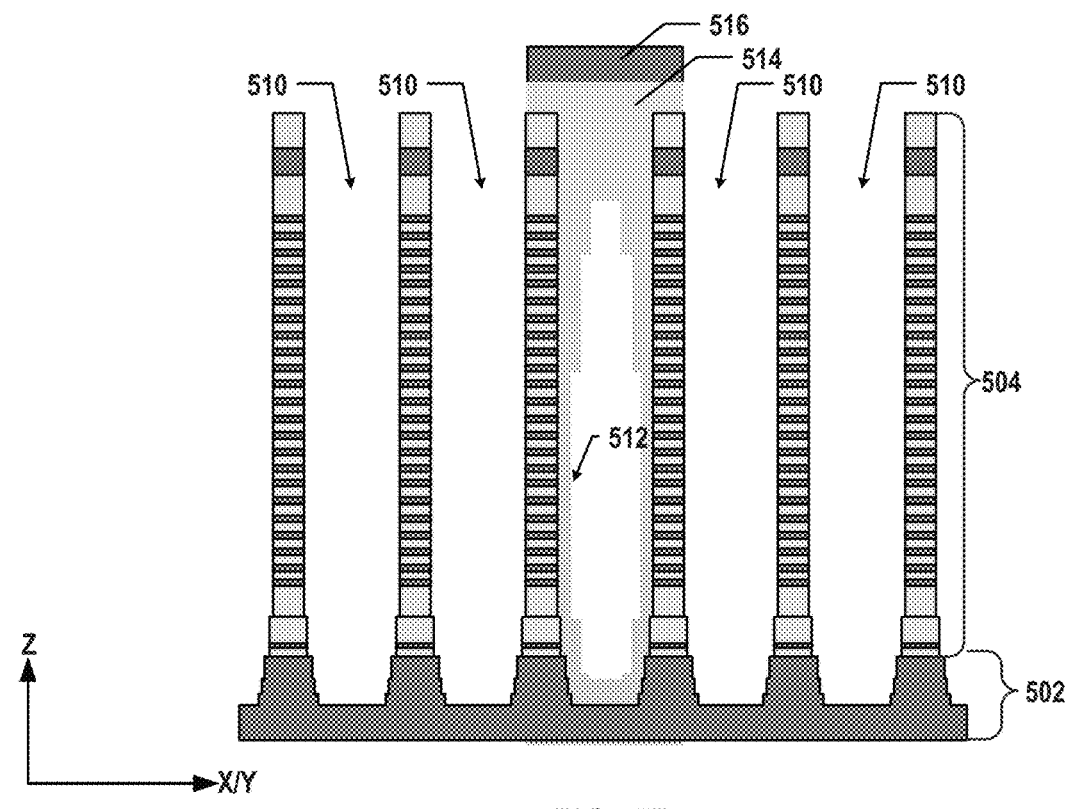

Method 700 proceeds to operation 706, as illustrated in FIG. 7, in which a sealing layer is formed in each of the contact holes. In the example of FIG. 8, at operation 808, a sealing layer is deposited in each of the contact holes. As illustrated in FIG. 5B, a sealing layer 514 is formed to fill in and cover channel holes 510 and contact holes 512. Sealing layer 514 can be formed by depositing a sacrificial layer, such as polysilicon, which is to be later removed, to partially fill in and cover channel holes 510 and contact holes 512 using one or more thin film deposition processes including ALD, CVD, PVD, any other suitable processes, or any combination thereof. As illustrated in FIG. 5C, a photoresist layer 516 (as a channel hole re-open mask) is patterned to cover part of sealing layer 514 right above contact hole 512 using photolithography and development processes. As illustrated in FIG. 5D, parts of sealing layer 514 right above channel holes 510 are removed using wet etching and/dry etching processes since they are not covered by photoresist layer 516, leaving sealing layer 514 to fill in and cover only contact hole 512. Channel holes 510 are thereby re-opened for later processes.

Method 700 proceeds to operation 708, as illustrated in FIG. 7, in which a channel structure is formed in each of the channel holes. In the example of FIG. 8, at operation 810, a memory film and a semiconductor channel are subsequently deposited along a sidewall of each of the channel holes. In some embodiments, a semiconductor plug is formed in the lower portion of each of the channel holes, and a channel plug is formed in the upper portion of each of the channel holes.

Figure 5E:
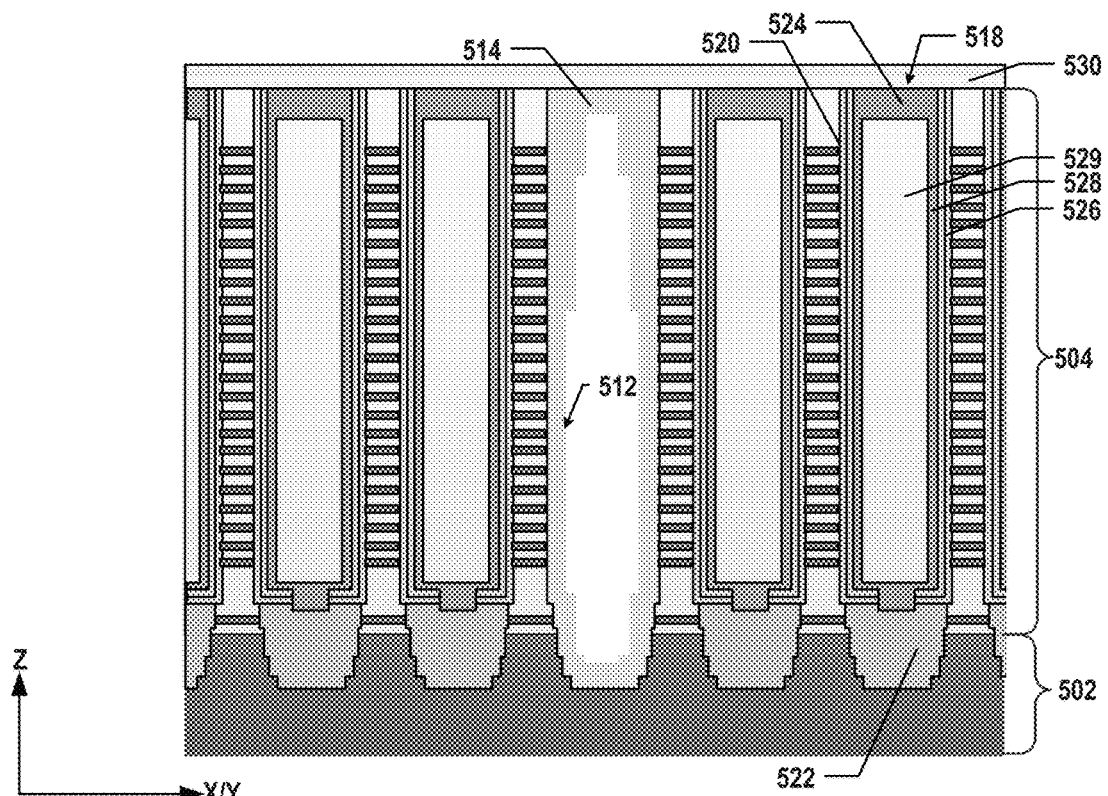

As illustrated in FIG. 5E, a silicon plug 522 is formed by filling the lower portion of channel hole 512 (shown in FIG. 5D) with single crystalline silicon epitaxially grown from silicon substrate 502 in any suitable directions (e.g., from bottom surface and/or side surface). The fabrication processes for epitaxially growing silicon plug 320 can include, but not limited to, vapor-phase epitaxy (VPE), liquid-phase epitaxy (LPE), molecular-beam epitaxy (MPE), or any combinations thereof.

As illustrated in FIG. 5E, a channel structure 520 is formed above silicon plug 522 in channel hole 512. Channel structure 520 can include a memory film 526 (e.g., including a blocking layer, a storage layer, and a tunneling layer) and a semiconductor channel 528 formed above silicon plug 522. In some embodiments, memory film 526 is first deposited along the sidewall and bottom surface of channel hole 510, and semiconductor channel 528 is then deposited over memory film 526 and above silicon plug 522. The blocking layer, storage layer, and tunneling layer can be subsequently deposited in this order using one or more thin film deposition processes, such as ALD, CVD, PVD, any other suitable processes, or any combination thereof, to form memory film 526. Semiconductor channel 528 can then be deposited on the tunneling layer using one or more thin film deposition processes, such as ALD, CVD, PVD, any other suitable processes, or any combination thereof. In some embodiments, a capping layer 529 is filled in the remaining space of channel hole 510 by depositing dielectric materials after the deposition of semiconductor channel 528, such as silicon oxide.

As illustrated in FIG. 5E, a channel plug 524 is formed in the upper portion of channel hole 512. In some embodiments, parts of memory film 526, semiconductor channel 528, and capping layer 529 on the top surface of dielectric stack 504 and in the upper portion of channel hole 510 can be removed by CMP, grinding, wet etching, and/or dry etching to form a recess in the upper portion of channel hole 510. Channel plug 524 then can be formed by depositing conductive materials, such as metals, into the recess by one or more thin film deposition processes, such as CVD, PVD, ALD, electroplating, electroless plating, or any combination thereof. A NAND memory string 518 is thereby formed. In some embodiments, an insulation layer 530 including dielectric materials, such as silicon oxide, is formed on dielectric stack 504 after the formation of channel structures 520 of NAND memory strings 518.

Figure 5F:
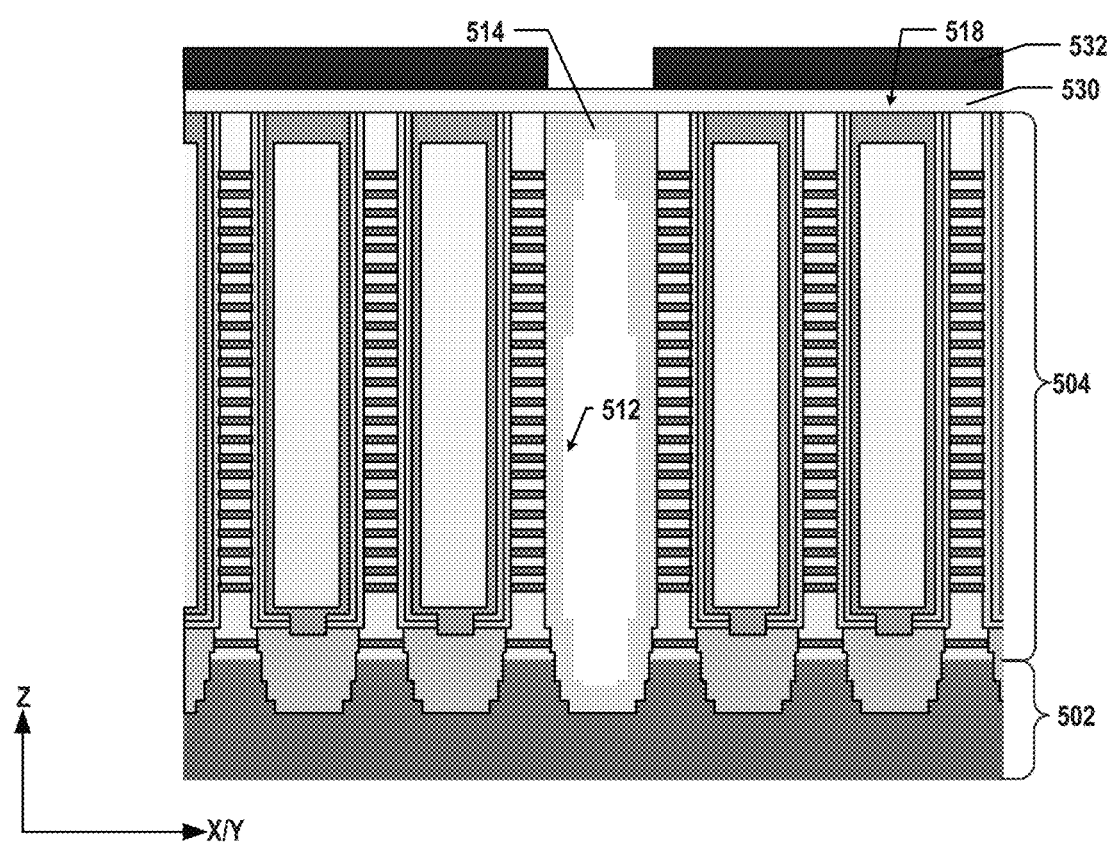
Figure 5G:
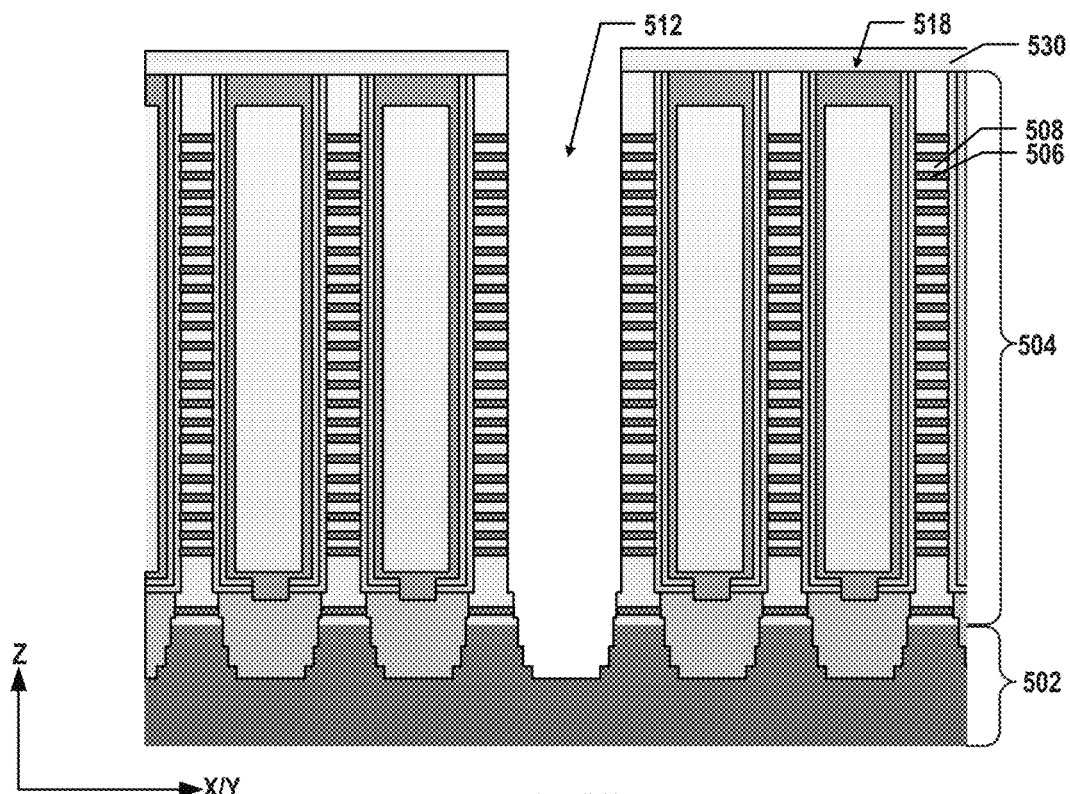

Method 700 proceeds to operation 710, as illustrated in FIG. 7, in which the sealing layer is removed from each of the contact holes. In the example of FIG. 8, at operation 812, the sealing layer is etched away in each of the contact holes. As illustrated in FIG. 5F, a photoresist layer 532 (as a contact hole re-open mask) is patterned to cover parts of insulation layer 530 right above NAND memory strings 518 using photolithography and development processes. As illustrated in FIG. 5G, part of insulation layer 530 right above contact hole 512 and sealing layer 514 that fills in and covers contact hole 512 (shown in FIG. 5F) are removed using wet etching and/or dry etching processes since they are not covered by photoresist layer 532 (shown in FIG. 5F). Contact holes 512 are thereby re-opened for later processes.

Method 700 proceeds to operation 712, as illustrated in FIG. 7, in which a memory stack including interleaved conductive layers and dielectric layers is formed. In the example of FIG. 8, at operation 814, the sacrificial layers are replaced with the conductive layers through the contact holes to form the memory stack. In some embodiments, forming the memory stack includes etching the sacrificial layers in the dielectric stack, and depositing the conductive layers of the memory stack through the contact holes.

Figure 5H:
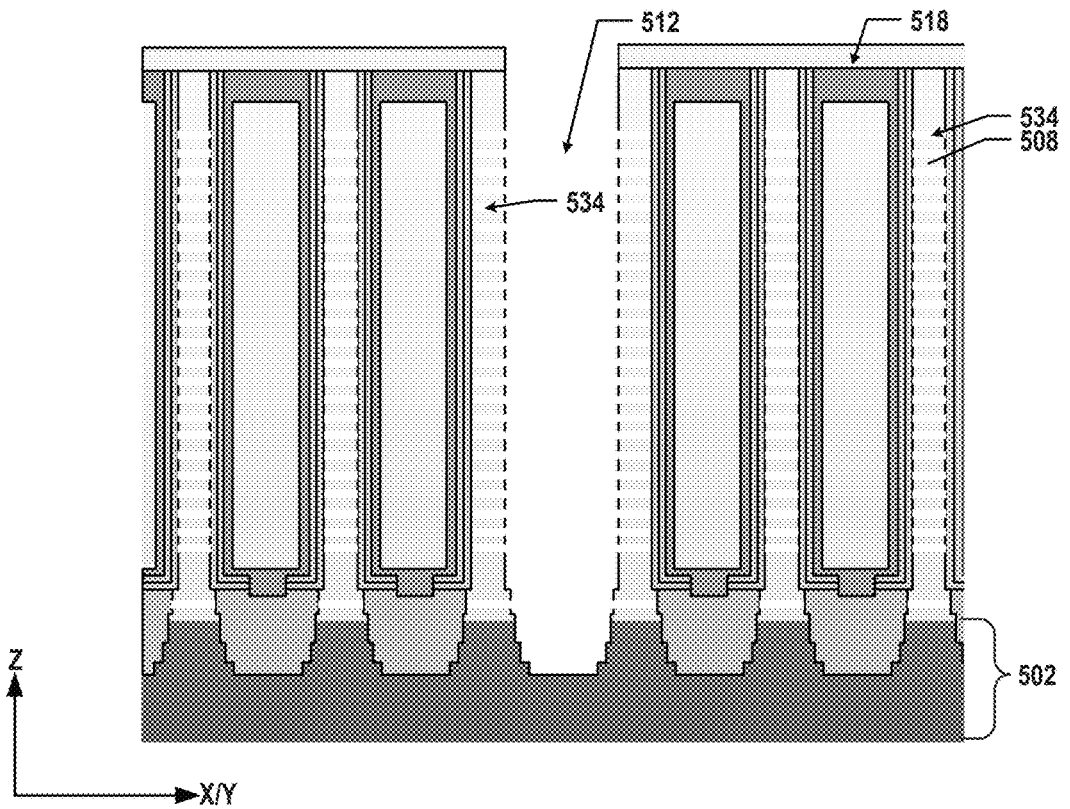

As illustrated in FIG. 5H, sacrificial layers 506 (shown in FIG. 5G) in dielectric stack 504 are removed by wet etching and/or dry etching selective to dielectric layers 508. Lateral recesses 534 connected to contact hole 512 can be formed after sacrificial layers 506 are completely etched away. In some embodiments, the etching process is facilitated by exposing contact hole 512 to hot phosphoric acid by which silicon nitride in sacrificial layers 506 is etched preferentially over silicon oxide in dielectric layers 508.

Figure 5I:
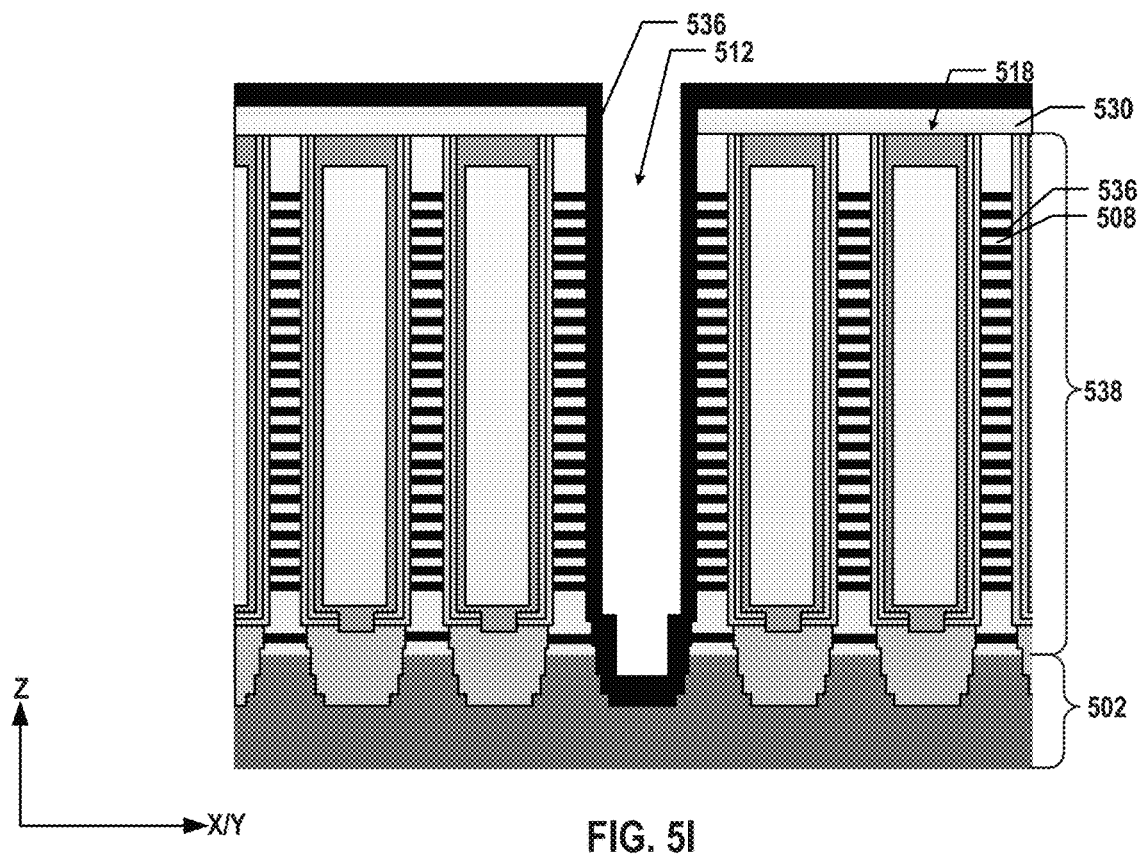

As illustrated in FIG. 5I, conductive layers 536 are formed along the sidewall of contact hole 512 and filling in lateral recesses 534 (shown in FIG. 5H). In some embodiments, conductive layer 536 is a composite layer including an adhesion layer and a conductor layer (e.g., a gate conductor/gate line). In some embodiments, a gate dielectric layer (not shown) is deposited prior to the deposition of conductive layer 536. The gate dielectric layer and conductive layer 536 can be formed by one or more thin film deposition processes, such as ALD, CVD, PVD, any other suitable processes, or any combination thereof. The gate dielectric layer can include dielectric materials including silicon nitride, high-k dielectrics, or any combination thereof. Conductive layer 536 can include conductive materials including, but not limited to, W, Co, Cu, Al, polysilicon, silicides, or any combination thereof. In some embodiments, the gate dielectric layer, adhesion layer, and conductor layer are each formed by CVD processes in which the reaction gases pass through contact hole 512 to lateral recesses 534 and are reacted and deposited along the sidewalls of contact hole 512 and lateral recesses 534. Conductive layers 536 thereby replace sacrificial layers 506 to transfer dielectric stack 504 into a memory stack 538.

Method 700 proceeds to operation 714, as illustrated in FIG. 7, in which a plurality of recesses abutting a sidewall of each of the contact holes are formed, such that the contact holes are joined laterally to form a slit opening. In the example of FIG. 8, at operation 816, parts of the conductive layers abutting a sidewall of each of the contact holes are etched, such that lower portions of the contact holes are joined laterally.

Figure 5J:
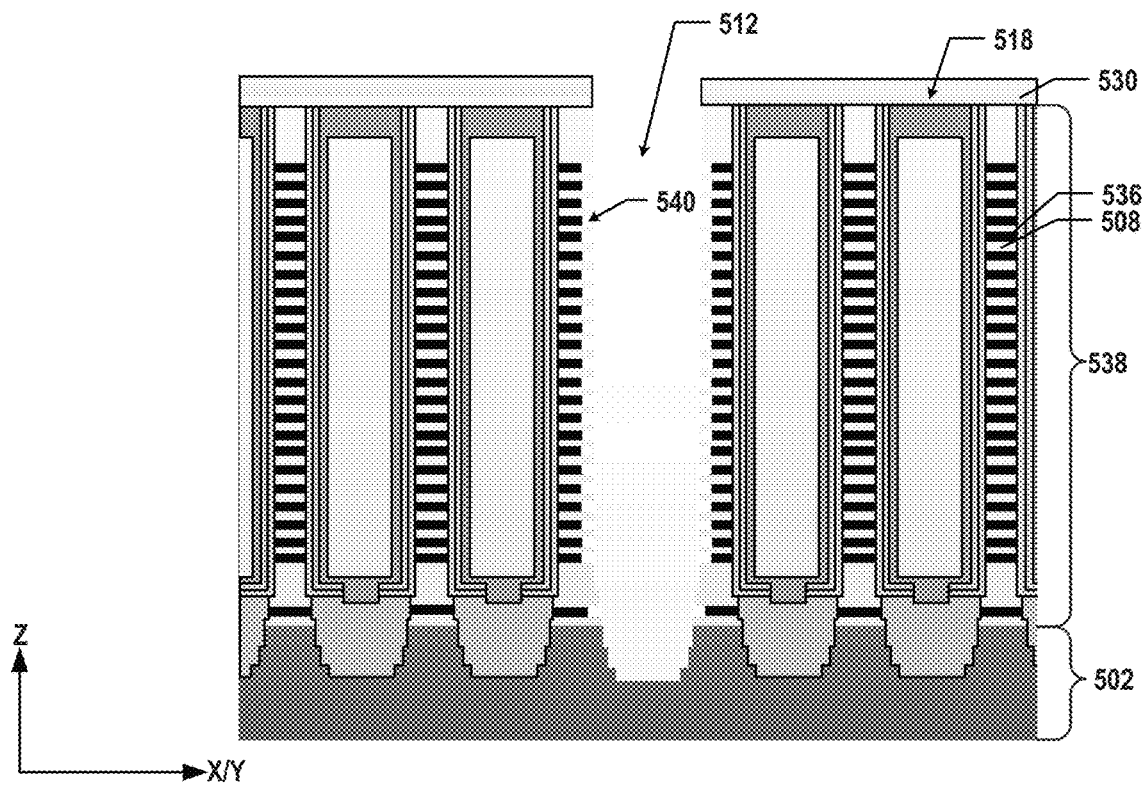

As illustrated in FIG. 5J, recesses 540 abutting the sidewall of contact hole 512 are formed by etching parts of conductive layers 536 of memory stack 538 that abut the sidewall of contact hole 512. In some embodiments, recesses 540 are formed by applying etchants to conductive layers 536 through contact hole 512 to completely remove part of conductive layer 536 along the sidewall of contact hole 512 and further etch parts of conductive layers 536 in lateral recesses 534 (shown in FIG. 5H). The dimension of recess 540 can be controlled by the etching rate (e.g., based on the etchant temperature and concentration) and/or etching time.

Figure 6A:
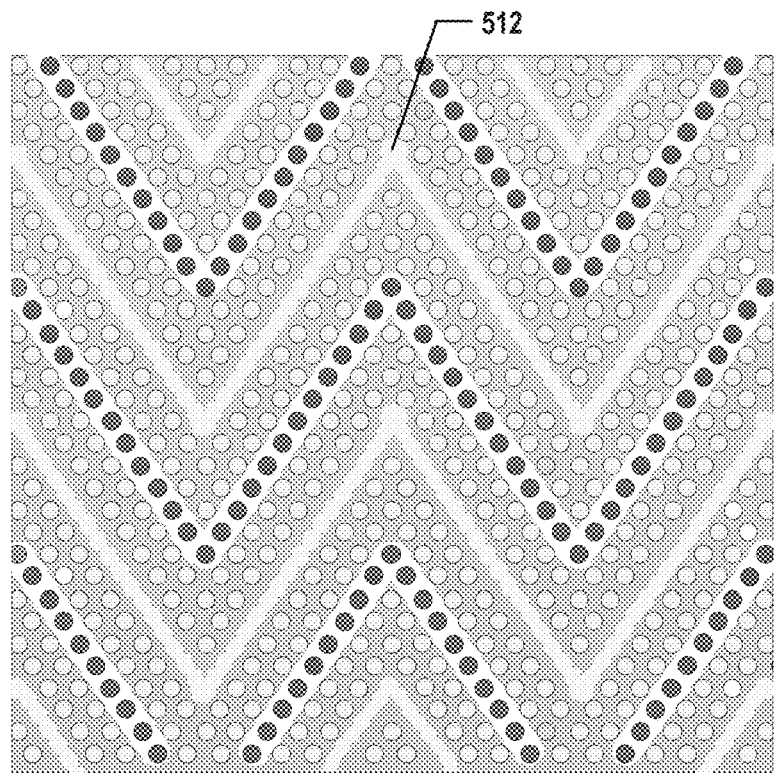
FIG. 6A illustrates plan views of an exemplary 3D memory device after gate replacement, according to some embodiments of the present disclosure.
Figure 6A:
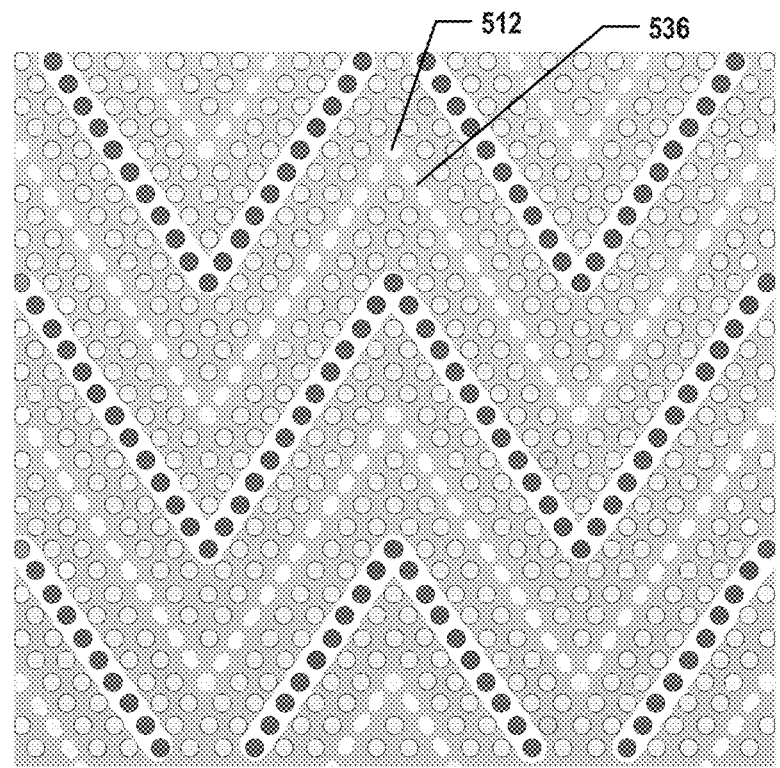

As described above, contact hole 512 can have a titled sidewall profile with the lateral dimension in the lower portion smaller than the lateral dimension in the upper portion. Thus, although the upper portions of adjacent contact holes 512 are joined laterally after the etching process forming contact holes 512, the lower portions of adjacent contact holes 512 may still not be joined laterally. For example, as shown in FIG. 6A, in the top figure, the upper portions of contact holes 512 are joined laterally after the gate replacement process (e.g., before forming the recesses abutting the sidewall of contact holes 512). In contrast, in the bottom figure, the lower portions of contact holes 512 are not joined laterally, but still separated laterally by conductive layers 536 of memory stack 538 after the gate replacement process (e.g., before forming the recesses abutting the sidewall of contact holes 512).

By forming recesses 540 abutting the sidewall of contact hole 512, contact hole 512 can be enlarged, in particular in its lower portion, to ensure that it can be joined laterally with adjacent contact holes 512 even in their lower portions. As a result, a slit opening in a zigzag pattern in the plan view can be formed by laterally joining contact holes 512 arranged in the zigzag pattern.

Figure 5K:
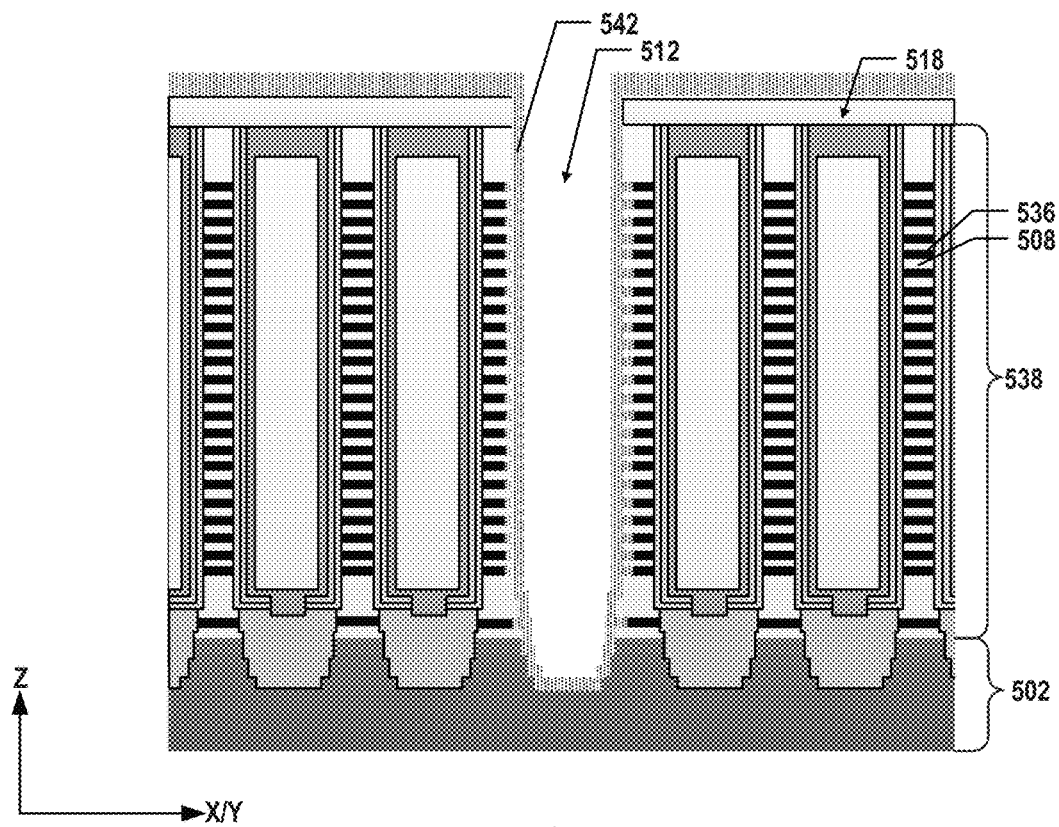

Method 700 proceeds to operation 716, as illustrated in FIG. 7, in which a spacer is formed along a sidewall of the slit opening to electrically separate the conductive layers of the memory stack. In the example of FIG. 8, at operation 818, a spacer is deposited along the sidewall of each of the contact holes. As illustrated in FIG. 5K, a spacer 542 is formed along the sidewall of contact hole 512 and in recesses 540 (shown in FIG. 5J) using one or more thin film deposition processes, such as ALD, CVD, PVD, any other suitable processes, or any combination thereof. Spacer 542 can include a single or composite layer of dielectric materials, such as silicon oxide and silicon nitride. As described above, by forming recesses 540, both upper and lower portions of adjacent contact holes 512 can be joined to form a slit opening in a zigzag pattern. By covering the sidewall of the slit opening (i.e., the sidewalls of each contact hole 512 joining the slit opening) as well as filling in recesses 540 with spacer 542, conductive layers 536 (e.g., gate lines) of memory stack 538 can be electrically separated by spacer 542.

Figure 5L:
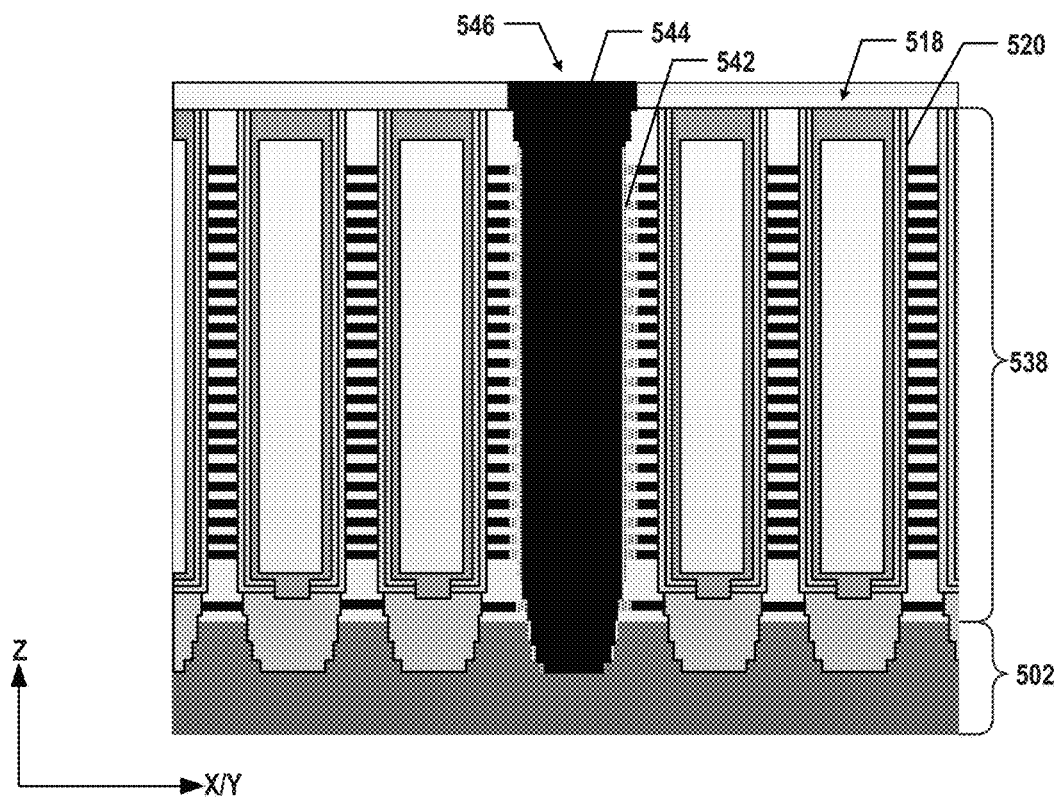

Method 700 proceeds to operation 718, as illustrated in FIG. 7, in which a slit contact is formed over the spacer in the slit opening. The slit contact is electrically connected to the channel structure. The slit contact can be deposited over the spacer in each of the contact holes. As illustrated in FIG. 5L, a slit contact 544 is formed over spacer 542 in contact hole 512 (shown in FIG. 5K). Slit contact 544 can be formed by depositing conductive materials including, not limited to, W, Co, Cu, Al, polysilicon, silicides, or any combination thereof, over spacer 542 in the slit opening (i.e., each contact hole 512 joining the slit opening) using one or more thin film deposition processes, such as ALD, CVD, PVD, any other suitable processes, or any combination thereof. Slit contact 544 can act as an ACS contact electrically connected to channel structures 520 of NAND memory strings 518 in the same memory region (e.g., memory block or memory finger).

Figure 6B:
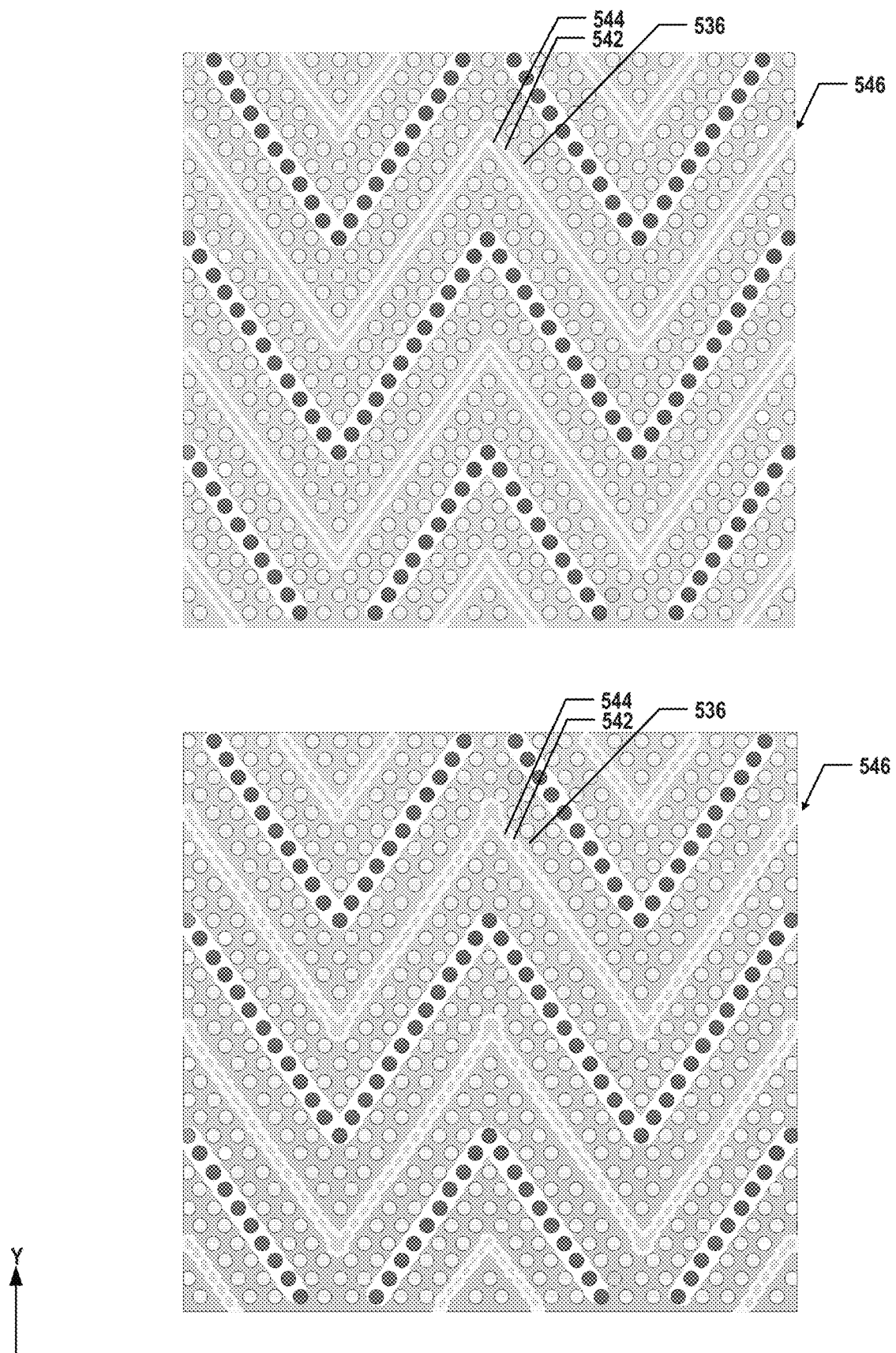
FIG. 6B illustrates plan views of an exemplary 3D memory device after slit structure formation, according to some embodiments of the present disclosure.

A slit structure 546 including spacer 542 and slit contact 544 is thereby formed in the slit opening formed by joining contact holes 512 in a zigzag pattern. For example, as shown in FIG. 6B, in the top figure, slit structure 546 includes slit contact 544 surrounded by spacer 542 that electrically separates slit contact 544 from conductive layers 536 (e.g., gate lines) as well as separates conductive layers 536 into different regions. Similarly, in the bottom figure, slit structure 546 includes slit contact 544 surrounded by spacer 542 that electrically separates slit contact 544 from conductive layers 536 (e.g., gate lines) as well as separates conductive layers 536 into different regions. Both slit contact 544 and spacer 542 in the lower portions of adjacent contact holes 512 are joined as well, like their counterparts in the upper portions of adjacent contact holes 512. Slit structure 546 thereby becomes a continuous structure extending laterally in a zigzag pattern.

According to one aspect of the present disclosure, a 3D memory device includes a substrate, a memory stack including interleaved conductive layers and dielectric layers above the substrate, an array of memory strings each extending vertically through the memory stack, and a plurality of slit structures laterally dividing the array of memory strings into a plurality of memory regions. Each of the plurality of slit structures extends vertically through the memory stack and extends laterally in a first zigzag pattern in a plan view.

In some embodiments, the first zigzag pattern is symmetrical. In some embodiments, the first zigzag pattern includes a plurality of turns each at a same angle. The angle can be 60°. An edge of the first zigzag pattern is wavelike, according to some embodiments.

In some embodiments, at least one of the slit structures includes a plurality of contact hole structures joined laterally. In some embodiments, at least one of the slit structures includes a plurality of contact hole structures, at least some of the contact hole structures are joined laterally, and at least two of the contact hole structures are separated laterally. One or more of the contact hole structures at turns of the first zigzag pattern can have a nominally circular shape in the plan view. The rest of the contact hole structures not at the turns of the first zigzag pattern can have a nominally oval shape in the plan view.

In some embodiments, a critical dimension of each of the contact hole structures at turns of the first zigzag pattern is larger than a critical dimension of each of the rest of the contact hole structures not at the turns of the first zigzag pattern. In some embodiments, a critical dimension of each of the contact hole structures at turns of the first zigzag pattern is larger than a critical dimension of each of the channel hole structures.

In some embodiments, the plurality of slit structures are spaced apart in a same pitch.

In some embodiments, the 3D memory device further includes a plurality of TSG cuts. Each of the plurality of TSG cuts extends vertically through part of the memory stack and extends laterally in a second zigzag pattern nominally parallel to the first zigzag pattern in the plan view.

According to another aspect of the present disclosure, a method for forming a 3D memory device is disclosed. A dielectric stack including interleaved sacrificial layers and dielectric layers is formed above a substrate. A plurality of channel holes and a plurality of contact holes are formed through the dielectric stack. The plurality of contact holes are formed in a zigzag pattern in a plan view. A channel structure is formed in each of the channel holes. A memory stack including interleaved conductive layers and dielectric layers is formed by replacing, through the contact holes, the sacrificial layers in the dielectric stack with the conductive layers. A plurality of recesses abutting a sidewall of each of the contact holes are formed, such that the contact holes are joined laterally to form a slit opening. A spacer is formed along a sidewall of the slit opening to electrically separate the conductive layers of the memory stack.

In some embodiments, the plurality of channel holes and the plurality of contact holes are formed simultaneously through the dielectric stack.

In some embodiments, a slit contact is formed over the spacer in the slit opening. The slit contact is electrically connected to the channel structures.

In some embodiments, upper portions of the contact holes are joined laterally after forming the plurality of channel holes and the plurality of contact holes.

In some embodiments, one or more of the contact holes at turns of the zigzag pattern have a nominally circular shape in the plan view. In some embodiments, the rest of the contact holes not at the turns of the zigzag pattern have a nominally oval shape in the plan view.

In some embodiments, a sealing layer is formed in each of the contact holes prior to forming the channel structure, and the sealing layer is removed from each of the contact holes after forming the channel structure.

In some embodiments, to form the plurality of recesses, parts of the conductive layers in the memory stack that abut the sidewall of the contact hole are etched.

In some embodiments, the zigzag pattern is symmetrical. In some embodiments, the zigzag pattern includes a plurality of turns each at a same angle. The angle can be 60°. An edge of the zigzag pattern is wavelike, according to some embodiments.

According to still another aspect of the present disclosure, a method for forming a 3D memory device is disclosed. Interleaved sacrificial layers and dielectric layers are alternatingly deposited above a substrate. The interleaved sacrificial layers and dielectric layers are etched through to form a plurality of channel holes and a plurality of contact holes in a zigzag pattern in a plan view. Upper portions of the contact holes are joined laterally. A sealing layer is deposited in each of the contact holes. The sealing layer is etched away in each of the contact holes after depositing a channel structure in each of the channel holes. The sacrificial layers are replaced with a plurality of conductive layers through the contact holes. Parts of the conductive layers abutting a sidewall of each of the contact holes are etched, such that lower portions of the contact holes are joined laterally. A spacer is deposited along the sidewall of each of the contact holes.

In some embodiments, a slit contact is deposited over the spacer in each of the contact holes.

In some embodiments, one or more of the contact holes at turns of the zigzag pattern have a nominally circular shape in the plan view. In some embodiments, the rest of the contact holes not at the turns of the zigzag pattern have a nominally oval shape in the plan view.

In some embodiments, the zigzag pattern is symmetrical. In some embodiments, the zigzag pattern includes a plurality of turns each at a same angle. The angle can be 60°.

In some embodiments, prior to etching through the interleaved sacrificial layers and dielectric layers, an etching mask is patterned on the interleaved sacrificial layers and dielectric layers, wherein the etching mask comprises a plurality of first openings corresponding to the channel holes and a plurality of second openings corresponding to the contact holes.

In some embodiments, after depositing the sealing layer, a memory film and a semiconductor channel of the channel structure are subsequently deposited along a sidewall of each of the channel holes.

The foregoing description of the specific embodiments will so reveal the general nature of the present disclosure that others can, by applying knowledge within the skill of the art, readily modify and/or adapt for various applications of such specific embodiments, without undue experimentation, and without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
    a substrate;
    a memory stack comprising interleaved conductive layers and dielectric layers above the substrate;
    an array of memory strings each extending vertically through the memory stack; and
    a plurality of slit structures laterally dividing the array of memory strings into a plurality of memory regions, wherein each of the plurality of slit structures extends vertically through the memory stack and extends laterally in a first zigzag pattern in a plan view.

2. The 3D memory device of claim 1, wherein the first zigzag pattern is symmetrical.

3. The 3D memory device of claim 1, wherein the first zigzag pattern comprises a plurality of turns each at a same angle.

4. The 3D memory device of claim 3, wherein the angle is 60°.

5. The 3D memory device of claim 1, where an edge of the first zigzag pattern is wavelike.

6. The 3D memory device of claim 1, wherein at least one of the slit structures comprises a plurality of contact hole structures joined laterally.

7. The 3D memory device of claim 1, wherein:
    at least one of the slit structures comprises a plurality of contact hole structures;
    at least some of the contact hole structures are joined laterally; and
    at least two of the contact hole structures are separated laterally.

8. The 3D memory device of claim 6, wherein one or more of the contact hole structures at turns of the first zigzag pattern have a nominally circular shape in the plan view.

9. The 3D memory device of claim 8, wherein the rest of the contact hole structures not at the turns of the first zigzag pattern have a nominally oval shape in the plan view.

10. The 3D memory device of claim 9, wherein a critical dimension of each of the contact hole structures at turns of the first zigzag pattern is larger than a critical dimension of each of the rest of the contact hole structures not at the turns of the first zigzag pattern.

11. The 3D memory device of claim 8, wherein a critical dimension of each of the contact hole structures at turns of the first zigzag pattern is larger than a critical dimension of each of the channel hole structures.

12. The 3D memory device of claim 1, wherein the plurality of slit structures are spaced apart in a same pitch.

13. The 3D memory device of claim 1, further comprising a plurality of top select gate (TSG) cuts, wherein each of the plurality of TSG cuts extends vertically through part of the memory stack and extends laterally in a second zigzag pattern nominally parallel to the first zigzag pattern in the plan view.

14. A method for forming a three-dimensional (3D) memory device, comprising:
    forming a dielectric stack comprising interleaved sacrificial layers and dielectric layers above a substrate;
    forming a plurality of channel holes and a plurality of contact holes through the dielectric stack, wherein the plurality of contact holes are formed in a zigzag pattern in a plan view;
    forming a channel structure in each of the channel holes;
    forming a memory stack comprising interleaved conductive layers and dielectric layers by replacing, through the contact holes, the sacrificial layers in the dielectric stack with the conductive layers;
    forming a plurality of recesses abutting a sidewall of each of the contact holes, such that the contact holes are joined laterally to form a slit opening; and
    forming a spacer along a sidewall of the slit opening to electrically separate the conductive layers of the memory stack.

15. The method of claim 14, wherein the plurality of channel holes and the plurality of contact holes are formed simultaneously through the dielectric stack.

16. The method of claim 14, further comprising forming a slit contact over the spacer in the slit opening, wherein the slit contact is electrically connected to the channel structures.

17. The method of claim 14, wherein upper portions of the contact holes are joined laterally after forming the plurality of channel holes and the plurality of contact holes.

18. The method of claim 14, further comprising:
   forming a sealing layer in each of the contact holes prior to forming the channel structure; and
   removing the sealing layer from each of the contact holes after forming the channel structure.

19. The method of claim 14, wherein forming the plurality of recesses comprises etching parts of the conductive layers in the memory stack that abut the sidewall of the contact hole.

20. A method for forming a three-dimensional (3D) memory device, comprising:
   alternatingly depositing interleaved sacrificial layers and dielectric layers above a substrate;
   etching through the interleaved sacrificial layers and dielectric layers to form a plurality of channel holes and a plurality of contact holes in a zigzag pattern in a plan view, wherein upper portions of the contact holes are joined laterally;
   depositing a sealing layer in each of the contact holes;
   etching away the sealing layer in each of the contact holes after depositing a channel structure in each of the channel holes;
   replacing, through the contact holes, the sacrificial layers with a plurality of conductive layers;
   etching parts of the conductive layers abutting a sidewall of each of the contact holes, such that lower portions of the contact holes are joined laterally; and
   depositing a spacer along the sidewall of each of the contact holes.

21. The 3D memory device of claim 1, wherein the plurality of slit structures each comprise a spacer surrounding a slit contact.

* * * * *